(12) United States Patent
Ling et al.

(10) Patent No.: US 10,482,310 B2
(45) Date of Patent: *Nov. 19, 2019

(54) DISPLAY MODULE

(71) Applicant: SHANGHAI OXI TECHNOLOGY CO., LTD, Shanghai (CN)

(72) Inventors: Yan Ling, Shanghai (CN); Hong Zhu, Shanghai (CN)

(73) Assignee: SHANGHAI OXI TECHNOLOGY CO., LTD, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/068,448

(22) PCT Filed: Jun. 9, 2017

(86) PCT No.: PCT/CN2017/087665
§ 371 (c)(1),
(2) Date: Jul. 6, 2018

(87) PCT Pub. No.: WO2018/145379
PCT Pub. Date: Aug. 16, 2018

(65) Prior Publication Data
US 2019/0220643 A1 Jul. 18, 2019

(30) Foreign Application Priority Data
Feb. 9, 2017 (CN) .......................... 2017 1 0071578

(51) Int. Cl.
*G06K 9/00* (2006.01)
*H01L 27/32* (2006.01)
*H01L 27/146* (2006.01)

(52) U.S. Cl.
CPC .............. *G06K 9/0004* (2013.01); *G06K 9/00* (2013.01); *H01L 27/323* (2013.01);
(Continued)

(58) Field of Classification Search
None
See application file for complete search history.

(56) References Cited

U.S. PATENT DOCUMENTS 8,743,082 B2 * 6/2014 Ganapathi .......... G02B 26/0833
178/18.01

FOREIGN PATENT DOCUMENTS

CN 104021374 A 9/2014
CN 205656407 U 10/2016
(Continued)

OTHER PUBLICATIONS

International Search Report and Written Opinion from PCT/CN2017/087665, dated Nov. 9, 2017 (with English Translation of Written Opinion).

*Primary Examiner* — Matthew C Bella
*Assistant Examiner* — Brian D Shin
(74) *Attorney, Agent, or Firm* — Adsero IP

(57) ABSTRACT

A display module, including a self-luminous display panel and at least one point-shaped back light source, wherein in one of a plurality of optical fingerprint sensing areas of the self-luminous display panel, a largest square region whose center is closest to the point-shaped back light source is selected; in the largest square region, optical fingerprint sensing devices of the largest square region are divided into various device groups, and structures of the optical fingerprint sensing devices of the various device groups are configured. The structure of the display module is optimized to improve a fingerprint identification function of the display module.

20 Claims, 12 Drawing Sheets

(52) U.S. Cl.
CPC .... *H01L 27/3234* (2013.01); *H01L 27/14678* (2013.01); *H01L 27/3244* (2013.01)

(56) References Cited

FOREIGN PATENT DOCUMENTS

| | | |
|---|---|---|
| CN | 106228147 A | 12/2016 |
| CN | 106298856 A | 1/2017 |
| KR | 20170010201 A | 1/2017 |
| WO | WO 2015/005959 A1 | 1/2015 |
| WO | WO 2016/171369 A1 | 10/2016 |

\* cited by examiner

# DISPLAY MODULE

CROSS-REFERENCE TO RELATED APPLICATIONS

This application is the national phase of International Application No. PCT/CN2017/087665, filed on Jun. 9, 2017, which claims the benefit of priority to Chinese Patent Application No. 201710071578.X, filed on Feb. 9, 2017, and entitled "Display Module", the entire disclosure of which is incorporated herein by reference.

TECHNICAL FIELD

The present disclosure relates to the field of photoelectric display, and more particularly, to a display module.

BACKGROUND

Existing display modules are generally used in displaying output information of electronic products. And existing display modules used for mobiles devices such as mobile phones may be integrated with a finger touch sensitive layer.

Among various kinds of display modules, a display module with self-luminous display panel is lighter and thinner and saves energy as it does not need a back light source, and such kind of display module is an important development direction.

However, on one hand, functions of the existing self-luminous display panels and display modules are still simple; on the other hand, the structures of the existing self-luminous display panels and display modules need to be optimized if they are integrated with structures of other functions.

SUMMARY

Embodiments of the present disclosure provide a display module. By integrating optical fingerprint sensing devices in a self-luminous display panel of the display module and disposing a point-shaped back light source for fingerprint identification below the self-luminous display panel, the display module is enabled to have a fingerprint identification function. Further, through a layout of the optical fingerprint sensing devices disposed in the self-luminous display panel, the optical fingerprint sensing devices disposed at different positions may receive light emitted from the point-shaped back light source at same level intensity, which may improve performance of fingerprint identification function.

Embodiments of the present disclosure provide a display module, including a self-luminous display panel, wherein the self-luminous display panel includes a display area where self-luminous display pixels are disposed, the display area includes a plurality of optical fingerprint sensing areas, the self-luminous display pixel disposed in the optical fingerprint sensing area includes a non-opaque area and an opaque area, at least a portion of the self-luminous display pixels disposed in the optical fingerprint sensing area include an optical fingerprint sensing device; and the optical fingerprint sensing device is disposed in the opaque area, and all the optical fingerprint sensing devices are arranged in rows and columns; and at least one point-shaped back light source, wherein one of the plurality of optical fingerprint sensing areas corresponds to one point-shaped back light source, and the point-shaped back light source is disposed obliquely below an outermost row of the optical fingerprint sensing devices in the optical fingerprint sensing area; wherein in one of the plurality of optical fingerprint sensing areas, a largest square region whose center is the closest to the point-shaped back light source is selected, and the largest square region may include 2x×2x optical fingerprint sensing devices, or (2x+1)×(2x+1) optical fingerprint sensing devices, wherein x is an integer greater than 2; wherein in the largest square region, two rows and two columns of the optical fingerprint sensing devices furthest from the point-shaped back light source are set as an $x^{th}$ device group, and two rows and two columns of the optical fingerprint sensing devices that are the secondly furthest from the point-shaped back light source as an $(x-1)^{th}$ device group, and other optical fingerprint sensing devices are set in a same manner, until the remained optical fingerprint sensing devices are set as a first device group; and at least one of the following two conditions may be satisfied among the optical fingerprint sensing devices in a $y^{th}$ device group and the optical fingerprint sensing devices in a $(y+1)^{th}$ device group, wherein y may be an integer from 1 to x: in a first condition, an effective photosensitive area of the optical fingerprint sensing devices in the $y^{th}$ device group is smaller than an effective photosensitive area of optical fingerprint sensing devices in the $(y+1)^{th}$ device group; or in a second condition, an area of the non-opaque area around the optical fingerprint sensing devices in the $y^{th}$ device group is smaller than an area of the non-opaque area around the optical fingerprint sensing devices in the $(y+1)^{th}$ device group.

Optionally, in the optical fingerprint sensing area, at least one optical fingerprint sensing device is configured in each pixel among k self-luminous display pixels in every group of m by n self-luminous display pixels in every optical fingerprint sensing area, where m and n may be integers no less than 1, and k may be an integer from 1 to m×n.

Optionally, in the first condition, an device photosensitive area of the optical fingerprint sensing devices in the $y^{th}$ device group is smaller than an device photosensitive area of the optical fingerprint sensing devices in the $(y+1)^{th}$ device group, and the device photosensitive area is equal to the effective photosensitive area, so as to make the effective photosensitive area of the optical fingerprint sensing devices in the $y^{th}$ device group be smaller than the effective photosensitive area of the optical fingerprint sensing devices in the $(y+1)^{th}$ device group.

Optionally, in the first condition, the device photosensitive areas of the optical fingerprint sensing devices may be the same, a light-blocking layer is disposed above the optical fingerprint sensing devices, the light-blocking layer includes an opening exposing a surface of the optical fingerprint sensing devices, and an area of the opening of the light-blocking layer of the optical fingerprint sensing devices in the $y^{th}$ device group may be smaller than an area of the opening of the light-blocking layer of the optical fingerprint sensing devices in the $(y+1)^{th}$ device group, so as to make the effective photosensitive area of the optical fingerprint sensing devices in the $y^{th}$ device group be smaller than the effective photosensitive area of the optical fingerprint sensing devices in the $(y+1)^{th}$ device group.

Optionally, in the second condition, device photosensitive areas of the optical fingerprint sensing devices may be the same.

Optionally, in one of the plurality of optical fingerprint sensing areas, a rows of the optical fingerprint sensing devices disposed outside of the largest square region are remained, a may be an integer greater than 1, among the a rows of the optical fingerprint sensing devices, a row of the optical fingerprint sensing devices closest to the point-shaped back light source are set as an $(x+1)^{th}$ device group, and other optical fingerprint sensing devices are set in a same manner, until a row of the optical fingerprint sensing devices furthest from the point-shaped back light source are as an $(x+a)^{th}$ device group; or, in one of the optical fingerprint sensing area, 2a columns of the optical fingerprint sensing devices symmetrically disposed on two sides of the largest square region are remained, a may be an integer greater than 1, among the 2a columns of the optical fingerprint sensing devices, two columns of the optical fingerprint sensing devices closest to the point-shaped back light source are as an $(x+1)^{th}$ device group, and other optical fingerprint sensing devices are set in a same manner, until two columns of plurality of optical fingerprint sensing devices furthest from the point-shaped back light source are as an $(x+a)^{th}$ device group; and at least one of the following two conditions may be satisfied among the optical fingerprint sensing devices in a $z^{th}$ device group and the optical fingerprint sensing devices of a $(z+1)^{th}$ device group, wherein z may be any integer from x to x+a: in a first condition, an effective photosensitive area of the optical fingerprint sensing devices in the $z^{th}$ device group may be smaller than an effective photosensitive area of the optical fingerprint sensing devices in the $(z+1)^{th}$ device group; or in a second condition, an area of the non-opaque area around the optical fingerprint sensing devices in the $z^{th}$ device group may be smaller than an area of the non-opaque area around the optical fingerprint sensing devices in the $(z+1)^{th}$ device group.

Embodiments of the present disclosure provide a display module, including a self-luminous display panel, wherein the self-luminous display panel includes a display area where self-luminous display pixels are disposed, the display area includes a plurality of optical fingerprint sensing area, the self-luminous display pixels disposed in the optical fingerprint sensing area include a non-opaque area and an opaque area, at least a portion of the self-luminous display pixels disposed in the optical fingerprint sensing area include an optical fingerprint sensing device, and the optical fingerprint sensing device is disposed in the opaque area; and all the optical fingerprint sensing devices are arranged in rows and columns; and at least one point-shaped back light source, wherein one of the plurality of optical fingerprint sensing areas corresponds to one of the at least one point-shaped back light source, and the point-shaped back light source is disposed obliquely below an outermost row of the optical fingerprint sensing device disposed in the optical fingerprint sensing area; wherein in one of the plurality of optical fingerprint sensing areas, a largest rectangle region whose center is the closest to the corresponding point-shaped back light source is selected; and the largest rectangle region may include x×(2x−1) optical fingerprint sensing devices, including x rows and 2x−1 columns, or may include x×2x optical fingerprint sensing devices, including x rows and 2x columns, wherein x is an integer greater than 2; and in the largest rectangle region, one row and two columns of the optical fingerprint sensing devices furthest from the point-shaped back light source are set as an $x^{th}$ device group, and one row and two columns of the optical fingerprint sensing devices that are the secondly furthest from the point-shaped back light source are set as an $(x-1)^{th}$ device group, and other optical fingerprint sensing devices are set in a same manner, until remained optical fingerprint sensing devices are set as a first device group; and at least one of the following two conditions may be satisfied among the optical fingerprint sensing devices in a $y^{th}$ device group and the optical fingerprint sensing devices in a $(y+1)^{th}$ device group, wherein y may be any integer from 1 to x: in a first condition, an effective photosensitive area of the optical fingerprint sensing devices in the $y^{th}$ device group may be smaller than an effective photosensitive area of the optical fingerprint sensing devices in the $(y+1)^{th}$ device group; or in a second condition, an area of the non-opaque area around the optical fingerprint sensing devices in the $y^{th}$ device group may be smaller than an area of the non-opaque area around the optical fingerprint sensing devices in the $(y+1)^{th}$ device group.

Optionally, in the optical fingerprint sensing area, among each of the m×n self-luminous display pixels, each of the k self-luminous display pixels includes at least one of the plurality of optical fingerprint sensing devices, where m and n may be integers no less than 1, and k may be any integer from 1 to m×n.

Optionally, in the first condition, an device photosensitive area of the optical fingerprint sensing devices in the $y^{th}$ device group is smaller than an device photosensitive area of the optical fingerprint sensing devices in the $(y+1)^{th}$ device group, and the device photosensitive area is equal to the effective photosensitive area, so as to make the effective photosensitive area of the optical fingerprint sensing devices in the $y^{th}$ device group be smaller than the effective photosensitive area of the optical fingerprint sensing devices in the $(y+1)^{th}$ device group.

Optionally, in the first condition, the device photosensitive areas of the optical fingerprint sensing devices may be the same, and a light-blocking layer is disposed above the optical fingerprint sensing devices, and the light-blocking layer includes an opening exposing a surface of the optical fingerprint sensing devices, and an area of the opening of the light-blocking layer of the optical fingerprint sensing devices in the $y^{th}$ device group may be smaller than an area of the opening of the light-blocking layer of the optical fingerprint sensing devices in the $(y+1)^{th}$ device group, so as to make the effective photosensitive area of the optical fingerprint sensing devices in the $y^{th}$ device group be smaller than the effective photosensitive area of the optical fingerprint sensing devices in the $(y+1)^{th}$ device group.

Optionally, in the second condition, device photosensitive areas of the optical fingerprint sensing devices may be the same.

Optionally, in one of the plurality of optical fingerprint sensing areas, a rows of optical fingerprint sensing devices disposed outside of the largest rectangle region are remained, and a may be an integer greater than 1; among the a rows of optical fingerprint sensing devices, a row of the optical fingerprint sensing devices closest to the point-shaped back light source are as an $(x+1)^{th}$ device group, and other optical fingerprint sensing devices are set in a same manner, until a row of the optical fingerprint sensing devices furthest from the point-shaped back light source are as an $(x+a)^{th}$ device group; or in one of the plurality of optical fingerprint sensing areas, 2a columns of the optical fingerprint sensing devices symmetrically disposed on two sides of the largest rectangle region are remained, a may be an integer greater than 1, among the 2a columns of the optical fingerprint sensing devices, two columns of the optical fingerprint sensing devices closest to the point-shaped back light source are set as an $(x+1)^{th}$ device group, and other optical fingerprint sensing devices are set in a same manner, until two columns of optical fingerprint sensing devices furthest from the point-shaped back light source are set as an $(x+a)^{th}$ device group; and at least one of the following two conditions may be satisfied among the optical fingerprint sensing devices in a $z^{th}$ device group and the optical fingerprint sensing devices in a $(z+1)^{th}$ device group, wherein z may be an integer from x to x+a: in a first condition, an effective photosensitive area of the optical fingerprint sensing devices in the $z^{th}$ device group may be smaller than an effective photosensitive area of the optical fingerprint sensing devices in the $(z+1)^{th}$ device group; or in a second condition, the area of the non-opaque area around the optical fingerprint sensing devices in the $z^{th}$ device group may be smaller than the area of the non-opaque area around the optical fingerprint sensing devices in the $(z+1)^{th}$ device group.

Embodiments of the present disclosure provide a display module, including a self-luminous display panel, wherein the self-luminous display panel includes a display area where a self-luminous display pixel are disposed; the display area includes a plurality of optical fingerprint sensing areas, the self-luminous display pixel disposed in the optical fingerprint sensing area includes a non-opaque area and an opaque area, at least a portion of the self-luminous display pixels disposed in the optical fingerprint sensing area include an optical fingerprint sensing device; wherein the optical fingerprint sensing device is disposed in the opaque area; and the optical fingerprint sensing devices are arranged in rows and columns; and at least one point-shaped back light source, wherein one of the plurality of optical fingerprint sensing areas corresponds to the at least one point-shaped back light source; and the at least one point-shaped back light source is disposed obliquely below the optical fingerprint sensing devices; one of the plurality of the optical fingerprint sensing areas may be divided into a plurality of light intensity areas from a first light intensity area to an $x^{th}$ light intensity area according to a distance relative to the point-shaped back light source from a shortest distance to a longest distance, and an overall shape of a second light intensity area to an $(x-1)^{th}$ light intensity area may be an arc bar or an elliptical arc bar, wherein x may be an integer greater than 3; the optical fingerprint sensing devices disposed in the first light intensity area may be set as a first device group, the optical fingerprint sensing devices disposed in the second light intensity area may be set as a second device group, and the optical fingerprint sensing devices disposed in the $x^{th}$ light intensity area may be set as an $x^{th}$ device group; and at least one of the following two conditions may be satisfied among the optical fingerprint sensing devices of a $y^{th}$ device group and the optical fingerprint sensing devices in a $(y+1)^{th}$ device group, wherein y may be an integer from 1 to x: in a first condition, an effective photosensitive area of the optical fingerprint sensing devices in the $y^{th}$ device group may be smaller than an effective photosensitive area of the optical fingerprint sensing devices in the $(y+1)^{th}$ device group; or in a second condition, an area of the non-opaque area around the optical fingerprint sensing devices of the $y^{th}$ device group may be smaller than an area of the non-opaque area around the optical fingerprint sensing devices in the $(y+1)^{th}$ device group.

Optionally, in the optical fingerprint sensing area, at least one optical fingerprint sensing device is configured in each pixel among k self-luminous display pixels in every group of m by n self-luminous display pixels in every optical fingerprint sensing area, where m and n may be integers no less than 1, and k may be an integer from 1 to m×n; and in the optical fingerprint sensing area, the self-luminous display pixel may include a non-opaque area and an opaque area, the optical fingerprint sensing devices may be disposed in the non-opaque area.

Optionally, in the first condition, an device photosensitive area of the optical fingerprint sensing devices in the $y^{th}$ device group is smaller than an device photosensitive area of the optical fingerprint sensing devices in the $(y+1)^{th}$ device group, and the device photosensitive area is equal to the effective photosensitive area, so as to make the effective photosensitive area of the optical fingerprint sensing devices in the $y^{th}$ device group be smaller than the effective photosensitive area of the optical fingerprint sensing devices in the $(y+1)^{th}$ device group.

Optionally, in the first condition, the device photosensitive areas of the optical fingerprint sensing devices may be the same, a light-blocking layers is disposed above the optical fingerprint sensing devices, the light-blocking layer includes an opening exposing a surface of the optical fingerprint sensing devices, and an area of the opening of the light-blocking layer of the optical fingerprint sensing devices in the $y^{th}$ device group may be smaller than an area of the opening of the light-blocking layer of the optical fingerprint sensing devices in the $(y+1)^{th}$ device group, so as to make the effective photosensitive area of the optical fingerprint sensing devices in the $y^{th}$ device group be smaller than the effective photosensitive area of the optical fingerprint sensing devices in the $(y+1)^{th}$ device group.

Optionally, in the second condition, device photosensitive areas of the optical fingerprint sensing devices may be the same.

Optionally, if one of the optical fingerprint sensing devices is disposed in two different light intensity areas, the one of the optical fingerprint sensing devices may be considered to be disposed in one of the two different light intensity areas where a larger portion of the optical fingerprint sensing devices is disposed; and if one of the optical fingerprint sensing devices is disposed in two different light intensity areas, and the areas of the one of the optical fingerprint sensing devices disposed in the two different light intensity areas are the same, the one of the optical fingerprint sensing devices may be considered to be disposed in any one of the two different light intensity areas.

Compared with the existing techniques, embodiments of the present disclosure may have the following advantages.

The embodiments of the present disclosure may improve the optical fingerprint sensing devices disposed in the optical fingerprint sensing area by implementing different design on the plurality of optical fingerprint sensing devices to ensure that the optical fingerprint sensing devices disposed at different positions may receive approximately the same fingerprint signals, thereby improving quality of fingerprint images captured by the display module.

DETAILED DESCRIPTION

When a fingerprint identification function is integrated in existing self-luminous display panels, layouts of corresponding optical sensing devices in the panels are same. Because of the same layouts, the closer the optical sensing device to the point-shaped back light source, the stronger the corresponding light intensity is; and the farther the optical sensing device from the point-shaped back light source, the weaker the corresponding light intensity is. According to a quadratic power law decay rule of light of a light source, the same layouts of the optical sensing devices may lead to large differences among signals received by the optical sensing devices disposed at different positions, and the differences may further degrade quality of captured fingerprint images.

Embodiments of the present disclosure provide a display module. The display module is integrated with an optical fingerprint identification function, a plurality of optical sensing devices in the display module are divided into various device groups (the division of the various device groups is performed based on a nonlinear variation rule), and then the various device groups are treated according to different conditions, which makes the optical sensing devices disposed at different positions receive signals with less difference, thereby improving quality of fingerprint images captured and enhancing performance of the fingerprint identification function of the display module.

The foregoing objects, features and advantages of the present disclosure will become more apparent from the following detailed description of specific embodiments in conjunction with the accompanying drawings.

The upper and lower relations in this specification are defined by placing a display module under a user's eyes. That is, in a display module, if one structure is above another structure, the one structure is closer to the user's eyes than the another structure when the display module is placed under the user's eyes. Besides, areas mentioned in this specification referred to areas in a top view under the upper and lower relations described above.

Figure 1:
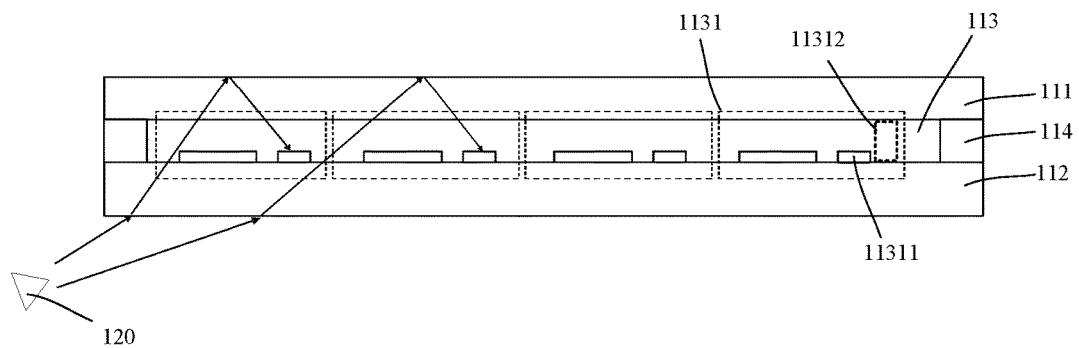
FIG. 1 is a schematic diagram of a cross-sectional view of a display module according to one embodiment of the present disclosure.

Referring to FIG. 1, one embodiment of the present disclosure provides a display module.

FIG. 1 is a schematic diagram of a cross-sectional view of a display module according to one embodiment of the present disclosure, and the display module includes a self-luminous display panel (not marked). The self-luminous display panel includes a first substrate 111, a second substrate 112 and a self-luminous circuit layer 113. The self-luminous circuit layer 113 is disposed between the first substrate 111 and the second substrate 112. The self-luminous display panel may include a sealing structure 114. The sealing structure 114 may be disposed between the first substrate 111 and the second substrate 112, and the sealing structure 114 may be disposed around the self-luminous circuit layer 113. The sealing structure 114 may seal the self-luminous circuit layer 113 between the first substrate 111 and the second substrate 112 by cooperating with the first substrate 111 and the second substrate 112, so as to isolate it from the air, vapor (water vapor) and so on in the environment.

In the present embodiment, the first substrate 111 and the second substrate 112 may be made of a non-opaque material which may be inorganic glass, organic glass, or other organic transparent resins.

In the present embodiment, the self-luminous display panel includes a plurality of self-luminous display pixels 1131 in a display area (not marked). Specifically, as the self-luminous display panel includes a self-luminous circuit layer 113, and the plurality of self-luminous display pixels 1131 are disposed at the self-luminous circuit layer 113, the self-luminous circuit layer 113 may be considered to include the display area.

In the present embodiment, the self-luminous display panel may be an OLED display panel, the self-luminous display pixels 1131 may include an anode layer, a hole injection layer (HIL), a (organic) light-emitting layer (EML), an electron injection layer (EM), a cathode layer and etc, and may further include a hole transport layer (HTL) and an electron transport layer (ETL), and may further include structures such as a TFT for driving OLED, driving metal wires and a storage capacitor. The principle of light-emitting of the OLED display panel is, if being driven in a certain voltage, electrons and holes may be transferred from the cathode layer and the anode layer to the light-emitting layer respectively, and then encounter in the light-emitting layer to form excitons and excite luminescence molecules, and the luminescence molecules may emit visible light (or other kinds of light) through radiation relaxation.

Figure 4:
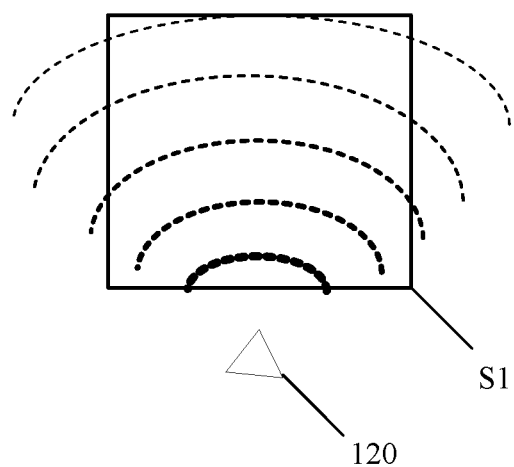
FIG. 4 is a schematic diagram of a top view of an optical fingerprint sensing area in a first situation according to one embodiment of the present disclosure.
Figure 7:
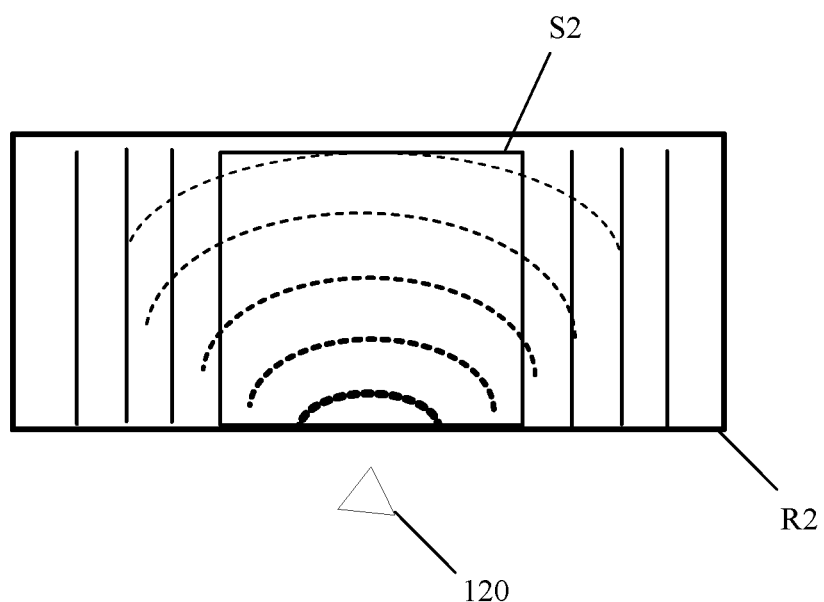
FIG. 7 is a schematic diagram of a top view of an optical fingerprint sensing area in a second situation according to one embodiment of the present disclosure.
Figure 10:
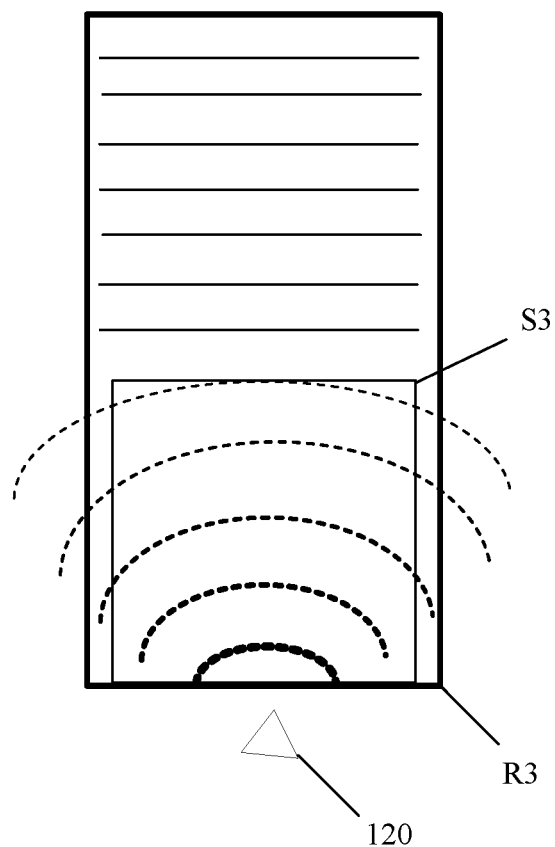
FIG. 10 is a schematic diagram of a top view of an optical fingerprint sensing area in a third situation according to one embodiment of the present disclosure.

In the present embodiment, the display area may be a rectangle in a top view, such as a square display area of s1 shown in FIG. 4, a rectangle display area R2 shown in FIG. 7 or a rectangle display area R3 shown in FIG. 10

In the present embodiment, the display area may include an optical fingerprint sensing area (not marked). On base of this, the present embodiment may include two conditions: in a first condition, an area of the optical fingerprint sensing area is equal to an area of the display area, that means, a region the display area disposed at is the region the optical fingerprint sensing area disposed at; in a second condition, the area of the optical fingerprint sensing area may be smaller than the area of the display area, that means, the optical fingerprint sensing area may be a portion of the display area. More details on the area of the display area and the optical fingerprint sensing area may be referred to FIG. 4, FIG. 7 and FIG. 10.

In some embodiments, the display area may include more than two optical fingerprint sensing areas. And each of the optical fingerprint sensing areas may be a portion of the display area; or a sum of optical fingerprint sensing areas may be equal to the display area, or be smaller than the display area.

As described above, the optical fingerprint sensing area includes a plurality of self-luminous display pixels 1131 arranged in rows and columns. FIG. 1 shows four self-luminous display pixels 1131 as representation, meaning that, in the self-luminous display panel, the self-luminous circuit layer 113 may include a plurality of self-luminous display pixels 1131. And, in FIG. 1, an area enclosed by a large dotted frame represents the area where the plurality of self-luminous display pixels 1131 are disposed and a position relationship between adjacent self-luminous display pixels. It should be noted that, although the large dotted frame includes a portion of the first substrate 111 and the second substrate 112, it is just for the convenience of illustration, the plurality of self-luminous display pixels may not include the first substrate 111 and the second substrate 112. Each of the plurality of self-luminous display pixels may include an optical fingerprint sensing device 11311.

In the present embodiment, the optical fingerprint sensing device 11311 may be a photoelectric conversion device, and may be a photodiode or a phototransistor formed by an amorphous silicon process, a low temperature polycrystalline silicon process, an oxide semiconductor process, or an organic semiconductor process.

In the present embodiment, the self-luminous display pixel 1131 disposed in the optical fingerprint sensing area may include at least one opaque area and at least one non-opaque area 11312. FIG. 1 shows one non-opaque area 11312 (that means an area occupied by the non-opaque area 11312 is an area enclosed by the small dotted frame of FIG. 1). The optical fingerprint sensing device 11311 is disposed in the opaque area.

In the present embodiment, the plurality of self-luminous display pixels 1131 of the display area may be arranged in rows and columns (an array) Therefore, the plurality of self-luminous display pixels 1131 in the optical fingerprint sensing area may also be arranged in rows and columns. And, in the present embodiment, each of the plurality of self-luminous display pixels 1131 arranged in rows and columns may include one optical fingerprint sensing device 11311, thus the optical fingerprint sensing devices 11211 may also be arranged in rows and columns.

In some embodiments, one optical fingerprint sensing device is configured in each self-luminous display pixel in every group of 2 by 2 self-luminous display pixels in every optical fingerprint sensing area. Each self-luminous display pixel may be a structure with a single self-luminous display pixel; i.e., each self-luminous display pixel may not include sub self-luminous display pixels. And, the optical fingerprint sensing devices may be disposed at an appropriate position in an area of the self-luminous display pixels. In some embodiments, the plurality of self-luminous display pixels may include a plurality of sub self-luminous display pixels (for example, may include three sub self-luminous display pixels or four self-luminous display pixels), and the optical fingerprint sensing devices may be disposed in an area outside of each of the plurality of self-luminous display pixels, or be disposed inside one of the plurality of self-luminous display pixels. It could be known from the description above that, the optical fingerprint sensing devices are evenly distributed in the plurality of self-luminous display pixels disposed in the optical fingerprint sensing area. Specifically, if each of the optical fingerprint sensing devices are disposed at a same position of every 2×2 self-luminous display pixels, for example, be disposed at a self-luminous display pixel placed on an upper left corner of every 2×2 self-luminous display pixels, the optical fingerprint sensing devices may be arranged in rows and columns more orderly.

In some embodiments, in the optical fingerprint sensing area, at least one optical fingerprint sensing device is configured in each pixel among k self-luminous display pixels in every group of m by n self-luminous display pixels in every optical fingerprint sensing area, where m and n may be integers no less than 1, and k may be an integer from 1 to m×n. On this premise, if k is 1 (i.e., in every group of m×n self-luminous display pixels, at least one optical fingerprint sensing device is configured in one self-luminous display pixel), where m and n may be integers no less than 1.

In some embodiments, m, n and k may choose values except a case including: m and n are 2, and k is 1. In some embodiments, at least one optical fingerprint sensing device is configured in each pixel among k self-luminous display pixels in every group of m by n self-luminous display pixels in every optical fingerprint sensing area, and at least one of the m and the n may be greater than 1, while k may be smaller than m×n. In some embodiments, each of the plurality of self-luminous display pixels may include one of the optical fingerprint sensing devices. In some embodiments, each of the plurality of self-luminous display pixels may include a plurality of optical fingerprint sensing devices. In some embodiments, each of the self-luminous display pixels in an odd row may include four optical fingerprint sensing devices, and each of the self-luminous display pixels in an even row may include two optical fingerprint sensing devices. In some embodiments, each of the self-luminous display pixels may include 3 sub self-luminous display pixels, and one sub self-luminous display pixel of the 1×2 self-luminous display pixels may include one optical fingerprint sensing device. In some embodiments, each of the self-luminous display pixels may include 3 sub self-luminous display pixels; and among two adjacent sub self-luminous display pixels in an odd row, one of the two adjacent sub self-luminous display pixels may include two optical fingerprint sensing devices, and the other one may include one optical fingerprint sensing devices.

In summary, in the present disclosure, it is necessary to provide at least a portion of the self-luminous display pixels disposed in the optical fingerprint sensing area with the optical fingerprint sensing devices which are disposed in the opaque area, and all the optical fingerprint sensing devices are arranged in rows and columns. In specific implementation, among the self-luminous display pixels 1131 arranged in rows and columns in the optical fingerprint sensing area, at least one optical fingerprint sensing device is configured in each pixel among k self-luminous display pixels in every group of m by n self-luminous display pixels, wherein m and n may be integers no less than 1, and k may be an integer from 1 to m×n.

It should be noted that, in some embodiments, a non-opaque area of one self-luminous display pixel may be connected with a non-opaque area of another self-luminous display pixel to form a non-opaque area with a larger area, where the two self-luminous display pixels may be adjacent, and an area between the two adjacent self-luminous display pixels is non-opaque.

It should be noted that, the opaque area mentioned in the present embodiment is not opaque in the whole area from top to bottom. Opaque layers may be disposed in the bottom of the opaque area, thus making photosensitive structures (e.g., a semiconductive layer or the optical fingerprint sensing device 11311) disposed above the opaque layers at the bottom of the opaque area be protected by the opaque layers and not be affected by light emitting from the bottom of the opaque area. However, in the opaque area, structures above the photosensitive structures are non-opaque, thus making the photosensitive structures be able to emit light from the top of the opaque area, or receiving a light emitting from the top of the opaque area. For example, a light-emitting layer of the self-luminous display pixels 1131 is disposed in the corresponding opaque area, but a light emitted from the light-emitting layer may go up to reach eyes of a user. For another example, a reflective light of a corresponding fingerprint may go down and be received by the optical fingerprint sensing area. Besides, some opaque areas are generated by structures with opaque portions contained in them, for example, some metal lines disposed in the self-luminous circuit layer 113 are opaque layers, or gates of TFT devices disposed in the self-luminous circuit layer 113 are opaque layers.

As described above, the light-emitting layer may be disposed in the opaque area. The light-emitting layer may have a certain transparency, and an electrode layer disposed above the light-emitting layer may be provided with a certain transparency, so as to ensure a display function of an OLED display panel. However, in practice, to improve light utilization efficiency of the OLED display panel, an electrode layer below the light-emitting layer may be opaque, and even be reflective, so as to enable more light to emit from the top of the light-emitting layer, thus raising brightness.

The optical fingerprint sensing devices 11311 are disposed in the opaque area, thus an opaque layer may be disposed below the optical fingerprint sensing devices 11311. However, it is better if light transmission ability of structures above the optical fingerprint sensing devices 11311 is stronger. Specifically, the stronger the light transmission ability of structures above the optical fingerprint sensing devices 11311 is, the more light reflected by fingerprints the optical fingerprint sensing devices 11311 can be received.

It should be noted that, a light blocking layer may be disposed above the optical fingerprint sensing devices 11311, the light-blocking layer may be used to shield incident light, that means a size of the non-opaque area 11312 may be adjusted by the light-blocking layer. In the present embodiment, the non-opaque area 11312 may be formed by an interaction between the opaque layer below the optical fingerprint sensing devices 11311 and the light-blocking layer above the optical fingerprint sensing devices 11311. An area including any structure among the opaque layer and the light-blocking layer may belong to the opaque area described above.

In the present embodiment, a height of the non-opaque area 11312 is set to be equal to a height of the self-luminous circuit layer 113, as shown in FIG. 1; that is, the non-opaque area 11312 may include a light transmitting structure from bottom to top of the non-opaque area 11312, so as to ensure that light can penetrate from the non-opaque area 11312 through the self-luminous circuit layer 113 (it should be noted that, the heights of the self-luminous circuit layers may be slightly differ from each other, but at least a portion of the heights of the self-luminous circuit layers may be equal to the heights of the corresponding non-opaque area 11312). And light may penetrate through the self-luminous circuit layer 113 from the non-opaque area 11312 to ensure that the display module can capture fingerprint images by using the point-shaped back light source 120 below the self-luminous display panel.

It should be noted that, the self-luminous circuit layer 113 is fabricated on the second substrate 112, and a gap layer (not shown) may be formed between the self-luminous circuit layer 113 and the first substrate 111. And the gap layer may be filled with inert gas, such as nitrogen and argon, so as to protect the self-luminous circuit layer 111 from being crushed by the first substrate 111. According to descriptions on the gap layer described above, light passes through the self-luminous display panel may include pass through the second substrate 112, the non-opaque area 11312, the gap layer and the first substrate 111.

It should be noted that, although not shown in the figure, an anti-reflective layer may be disposed on a lower surface of the second substrate 112 of the self-luminous display panel and under the optical fingerprint sensing area, to increase a proportion of light emitted from a point-shaped back light source 120 entering into the optical fingerprint sensing area.

In the present embodiment, in the optical fingerprint sensing area, a distance between adjacent optical fingerprint sensing devices 11311 may be set from 30 μm to 100 μm. There are two important requirements during fingerprint image acquisition. One is a resolution of an captured image, that is, a distance between adjacent optical fingerprint sensing devices 11311 can not be too long; the other is a capture area should be large enough, that is, the captured fingerprint image should have a certain area, so as to obtain enough fingerprint information. Therefore, a distance between adjacent optical fingerprint sensing devices 11311 may be set from 30 μm to 100 μm. It the distance between the adjacent optical fingerprint sensing devices is too long, a fingerprint image resolution would not be enough, and it cannot be used for fingerprint identification. If the distance between the adjacent optical fingerprint sensing devices is too short, though the fingerprint image resolution would be better, there will be no significant improvement in the actual fingerprint identification. In other words, as a pitch of human fingerprints is around 200 μm, dense arrangement of the optical fingerprint sensing devices 11311 has no practical advantages. Moreover, reduction of the size of the self-luminous display pixels may lead to the increase of data amount of the fingerprint images, thus increasing an image acquisition time and acquisition power consumption of the optical fingerprint sensing area, and a time of sequent fingerprint image processing.

As shown in FIG. 1, the display module may include a point-shaped back light source 120. And, one optical fingerprint sensing area may correspond to one point-shaped back light source. And, in the present embodiment, the point-shaped back light source 120 is disposed obliquely below an outermost row of the optical fingerprint sensing devices of the optical fingerprint sensing area. FIG. 1 is a schematic cross-sectional view, although it shows that the point-shaped back light source 120 is disposed obliquely below the corresponding optical fingerprint sensing area, it does not show that the point-shaped back light source 120 is obliquely below an outside of the outermost row. Schematic vies of an outside the outermost row may refer to a subsequent FIG. 4, FIG. 7 and FIG. 10.

The point-shaped back light source 120 may include a point LED, and light emitted from the point LED may be near-ultraviolet light, purple light, blue light, green light, yellow light, red light, near infrared light, or white light.

Figure 2:
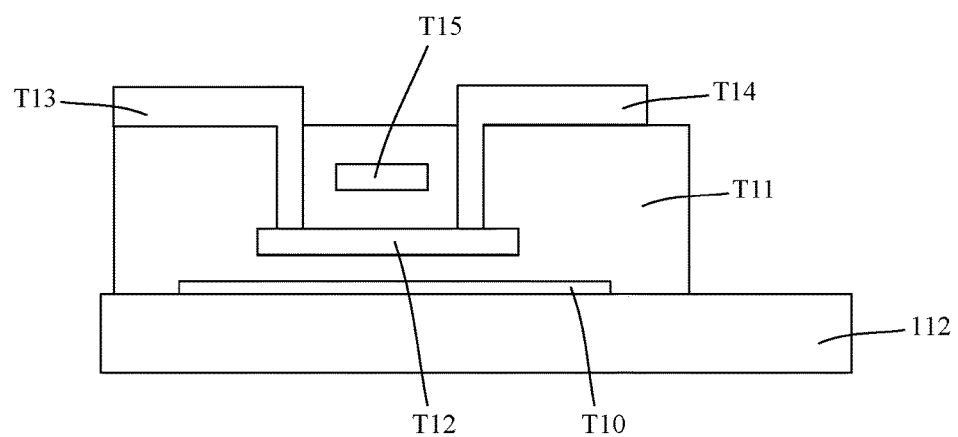
FIG. 2 is a structural diagram of a kind of a TFT in the display module in FIG. 1.

Referring to FIG. 2, FIG. 2 is a structural diagram of a kind of a TFT in FIG. 1. As shown in FIG. 2, the whole structure of the TFT is disposed above the second substrate 112. Firstly, correspondingly, a dielectric layer T11 is disposed above the second substrate 112, and the dielectric layer T11 is a multi-layer structure, which is fabricated through multiple processes. After fabricating a portion of the dielectric layer T11, a semiconductor layer T12 is fabricated, then a portion of the dielectric layer T11 is formed to cover the semiconductor layer T12, then form a gate electrode T15, finally, a portion of the dielectric layer T11 is formed to cover the gate electrode T15. Two ends of the semiconductor layer T12 are electrically connected to a conductive structure T13 and a conductive structure T14 respectively, and the conductive structure T13 and the conductive structure T14 are used to connect a source electrode (no marked) and a drain electrode (not marked), and an area in the middle of the semiconductor layer T12 serves as a channel region. The gate electrode T15 is disposed above the semiconductor layer T12, and a portion of the dielectric layer T11 is disposed between the gate electrode T15 and the semiconductor layer T12, this portion of the dielectric layer T11 may serve as a gate dielectric layer. And the gate electrode T15 is disposed above the semiconductor layer T12, thus a structure of the TFT is a top-gate structure. And the structure of the TFT may include a non-light-transmitting layer T10 disposed below the semiconductor layer T12. The non-light-transmitting layer T10 may be used to prevent the semiconductor layer T12 from being affected by light coming from a downside of the semiconductor layer T12. The structure of the TFT may be made by using a low temperature polycrystalline silicon process, or by using an amorphous silicon process, or by using an oxide semiconductor process.

In the present embodiment, the non-light-transmitting layer T10 may be electrically connected to a fixed potential (if the non-light-transmitting layer T10 is in a floating state, a potential of the non-light-transmitting layer T10 may be unknown and not be fixed. The non-light-transmitting layer T10 may also be a back gate of the TFT, if the potential of the non-light-transmitting layer T10 is unknown, an electrical performance of the TFT may be affected), so as to ensure an electrical stability of the TFT. And, an area of the non-light-transmitting layer T10 may be set to be larger than an area of the semiconductor layer T12, so as to better shield the semiconductor layer T12.

Figure 3:
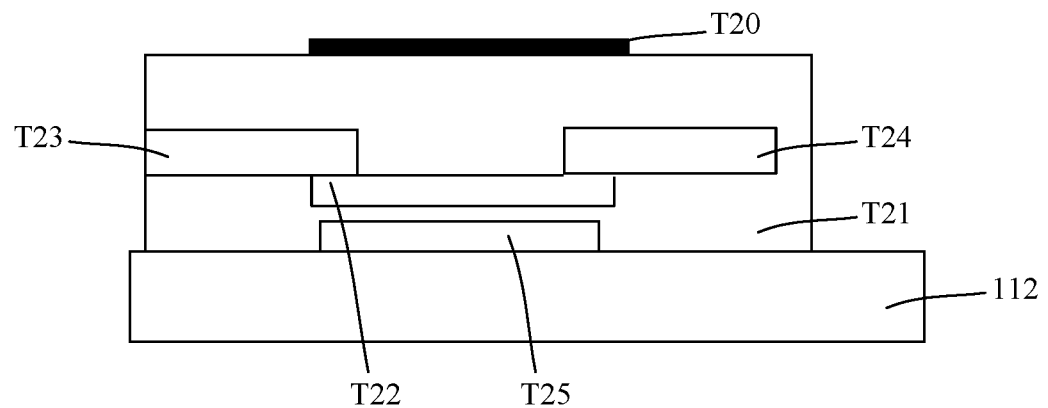
FIG. 3 is a structural diagram of another kind of a TFT in the display module in FIG. 1.

Referring to FIG. 3, FIG. 3 is a structural diagram of another kind of a TFT in the display module in FIG. 1. As shown in FIG. 3, a whole structure of the TFT is disposed above the second substrate 112. Firstly, correspondingly, a dielectric layer T21 is disposed above the second substrate 112, and the dielectric layer T21 is a multi-layer structure, which is fabricated through multiple processes. After a portion of the dielectric layer T21 is formed, a semiconductor layer T22 is fabricated, then a conductive structure T23 and a conductive structure T24 are formed, and finally a portion of the dielectric layer T21 is formed to cover the semiconductor layer T22. Two ends of the semiconductor layer T22 are electrically connected to the conductive structure T23 and the conductive structure T24 respectively, and the conductive structure T23 and the conductive structure T24 are used to connect a source electrode (no marked) and a drain electrode (not marked), and an area in the middle of the semiconductor layer T22 serves as a channel region. A gate electrode T25 is disposed below the semiconductor layer T22, and the gate electrode T25 may be directly formed on the surface of the second substrate 112. A portion of the dielectric layer T21 may be included between the gate electrode T25 and the semiconductor layer T22, this portion of dielectric layer T22 may serve as a gate dielectric layer. And the gate electrode T25 is disposed below the semiconductor layer T22, thus a structure of the TFT is a bottom-gate structure. And the structure of the TFT may include a non-light-transmitting layer T20 disposed below the semiconductor layer T22. The non-light-transmitting layer T20 may be used to prevent the semiconductor layer T22 from being affected by light coming from the top of the semiconductor layer T22. The structure of the TFT may be made by using a low temperature polycrystalline silicon process, an amorphous silicon process or an oxide semiconductor process.

In the present embodiment, the non-light-transmitting layer T20 may be electrically connected to a fixed potential (if the non-light-transmitting layer T20 is in a floating state, a potential of the non-light-transmitting layer T10 may be unknown and not be fixed. The non-light-transmitting layer T20 may also be a back gate of the TFT, if the potential of the non-light-transmitting layer T10 is unknown, an electrical performance of the TFT may be affected), so as to ensure electrical stability of the TFT. And, an area of the non-light-transmitting layer T20 may be set to be larger than an area of the semiconductor layer T22, so as to better shield the semiconductor layer T22.

In summary, in the display module provided in the present embodiment, optical fingerprint sensing devices 11311 are disposed in the self-luminous display pixels of the optical fingerprint sensing area (that is, the optical fingerprint sensing devices are integrated in the self-luminous circuit layer), the self-luminous display pixels in the optical fingerprint sensing area may include the non-opaque area around the optical fingerprint sensing devices 11311, and an upper substrate and a lower substrate of the self-luminous display panel (the first substrate 111 and the second substrate 112) may be non-opaque substrates. Besides, the point-shaped back light source 120 is disposed obliquely below the optical fingerprint sensing area of the self-luminous display panel (that is, below an edge of a side, i.e., looking downward, the point-shaped back light source 120 is disposed beyond the optical fingerprint sensing area). By disposing the point-shaped back light source below the self-luminous display panel, the optical fingerprint sensing devices 11311 are used to capture fingerprint images, thus realizing a fingerprint identification function. Further, the self-luminous display panel has a display function, the self-luminous display panel can realize the fingerprint identification function in cooperation with a corresponding back light source, which is equal to integrating the optical fingerprint sensors in the self-luminous display panel (such as an OLED display panel).

In the specific fingerprint image capturing process, light emitted from the point-shaped back light source 120 may enter the second substrate 112 titled upward, then penetrate through the self-luminous circuit layer 113 by the non-opaque area of the self-luminous circuit layer 113, and continue to reach the first substrate 111 (during a process of being transmitted from the self-luminous circuit layer 113 to the first substrate 111, the light may penetrate through the gap layer described above) and a reflection phenomena and a refraction phenomena may occur between the surface of the first substrate 111 and a fingerprint; then corresponding reflected light may return to the first substrate 111 and then enter the corresponding optical fingerprint sensing devices 11311, thereby being received by the optical fingerprint sensing devices 11311 to generate corresponding electric signals, so as to realize fingerprint image acquisition (the corresponding light is shown in FIG. 1 by black arrows, wherein refraction of the light is omitted).

The present embodiment only uses the point-shaped back light source 120 disposed below the self-luminous display panel as a light source for capturing the fingerprint image, and the self-luminous display pixels 1131 of the self-luminous display panel are not used as a light source for capturing the fingerprint image. That is because, when the self-luminous display pixels 1131 are directly used as a light source, light emitted from the self-luminous display pixels 1131 is stray light and may interfere with each other. In addition, a plurality of the self-luminous display pixels may increase such kind of crosstalk. Therefore, when a thickness of the self-luminous display panel is large, or a thickness of an additional protective layer (the protective layer may refer to subsequent embodiments) is great, using the self-luminous display pixels 1131 directly as a light source, an captured fingerprint image may be blurred due to the crosstalk between the light described above, thus a clear fingerprint image can not be obtained. Generally, if a thickness of the first substrate, or a total thickness of the "first substrate and the additional protective layer" is just greater than 0.4 mm, a clear fingerprint image may not be obtained.

However, the display module provided in the present embodiment uses the point-shaped back light source 120 disposed obliquely below the optical fingerprint sensing area of the self-luminous display panel as a light source, due to light emitted from the point-shaped back light source 120 (specifically, may be a LED) may have good isotropic property, a clear fingerprint image with high quality may be achieved. And if a thickness of the first substrate, or a total thickness of the "first substrate and the additional protective layer" is 10 mm, or even thicker than 10 mm, the problem of blurring of a fingerprint image would not exist, thus improving performance of fingerprint identification.

In addition, in the display module provided in the present embodiment, an optical fingerprint identification function is integrated into the self-luminous display panel to realize capturing fingerprint image in the display area (that is an area for displaying) of the display module, and reduce an appearance size of an electronic product applying the display module, thus increasing a screen proportion of the electronic product and improving aesthetic appearance of the electronic product.

To realize good capturing of a fingerprint image, the present embodiment continues to improve the optical fingerprint sensing devices performance disposed in the optical fingerprint sensing area by implementing different design on the optical fingerprint sensing devices, so as to make the optical fingerprint sensing devices be different with a certain rule.

Referring to FIGS. 4 to 15, differences of the optical fingerprint sensing devices in the optical fingerprint sensing area mentioned in the present embodiment are described in the following embodiments.

FIG. 4 is a schematic diagram of a top view of an optical fingerprint sensing area in a first situation according to one embodiment of the present disclosure, the top view of the optical fingerprint sensing area is a square. In the first kind of situation, the optical fingerprint sensing area may include 2x×2x optical fingerprint sensing devices, or (2x+1)×(2x+1) optical fingerprint sensing devices, where x is an integer greater than 2.

In the first kind of situation, in the optical fingerprint sensing area, a largest square region S1 closest to the point-shaped back light source 120 is selected. And, the largest square region S1 may be just the optical fingerprint sensing area itself. Specifically, when the optical fingerprint sensing area includes 2x×2x optical fingerprint sensing devices, the largest square region S1 may include 2x×2x optical fingerprint sensing devices; and when the optical fingerprint sensing area includes (2x+1)×(2x+1) optical fingerprint sensing devices, the largest square region S1 may include (2x+1)×(2x+1) optical fingerprint sensing devices.

In the first kind of situation, in the selected largest square region S1 described above, two rows and two columns of the optical fingerprint sensing devices furthest from the point-shaped back light source 120 are set as an $x^{th}$ device group, and two rows and two columns of the optical fingerprint sensing devices that are the secondly furthest from the point-shaped back light source are set as an $(x-1)^{th}$ device group, other optical fingerprint sensing devices are set in a same manner, until the remained optical fingerprint sensing devices are set as a first device group.

Further, in the first kind of situation, at least one of the following two conditions may be satisfied among the optical fingerprint sensing devices in a $y^{th}$ device group and the optical fingerprint sensing devices in a $(y+1)^{th}$ device group, and y may be an integer from 1 to x. In a first condition, an effective photosensitive area of the optical fingerprint sensing devices in the $y^{th}$ device group may be smaller than an effective photosensitive area of the optical fingerprint sensing devices in the $(y+1)^{th}$ device group. In a second condition, an area of the non-opaque area around the optical fingerprint sensing devices in the y device group may be smaller than an area of the non-opaque area around the optical fingerprint sensing devices in the $(y+1)^{th}$ device group.

It should be noted that the word "situation" and the word "condition" describe different contents in the present disclosure, and it can be seen from the first kind of situation and other two kinds of situations described below that all the three kinds of situations satisfy at least one of the first condition and the second condition.

Figure 5:
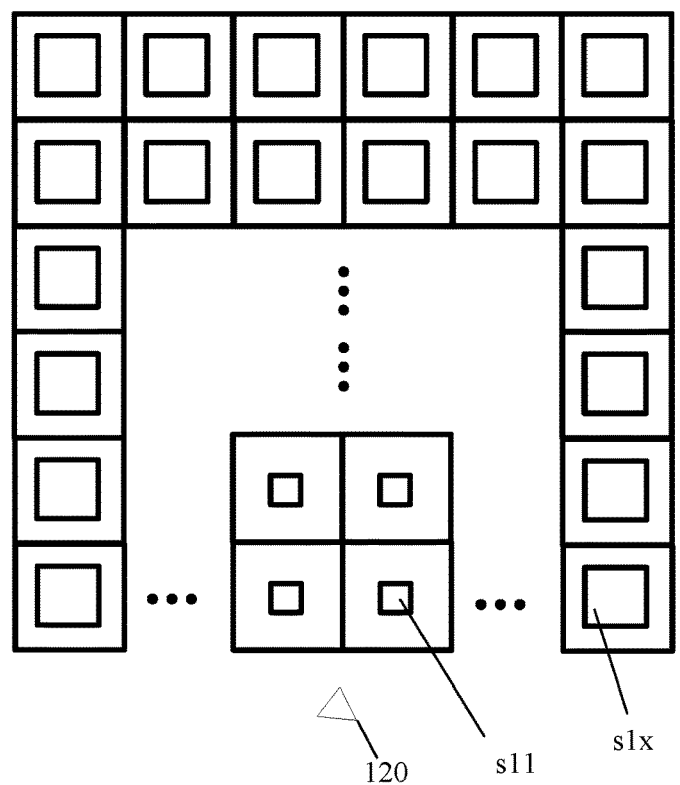
FIG. 5 is a schematic diagram of self-luminous display pixels in the first situation satisfying a first condition according to one embodiment of the present disclosure.

FIG. 5 is a schematic diagram of self-luminous display pixels in the first situation satisfying a first condition according to one embodiment of the present disclosure.

FIG. 5 shows self-luminous display pixels arranged in rows and columns (in FIG. 5, the self-luminous display pixels are not marked, and sizes of respective self-luminous display pixels are the same, as shown in each large rectangle in FIG. 5), and specifically exhibits two rows and two columns of the self-luminous display pixels farthest from point-shaped back light source 120 in the largest square region S1 (it should be noted that, in FIG. 5 and subsequent corresponding figures, two rows and two columns of the self-luminous display pixels farthest from the point-shaped back light source 120 are exhibited, and there are only six self-luminous display pixels exhibited in each row and column, but it is only for clear exhibition, a number of the self-luminous display pixels may be varied in an actual product), and four self-luminous display pixels (the four self-luminous display pixels are arranged in two rows and two columns) closest to the point-shaped back light source 120, dots in the figure indicate that some of the self-luminous display pixels are omitted.

As shown in FIG. 5, two of the four self-luminous display pixels closest to the point-shaped back light source 120 are optical fingerprint sensing devices s11 in the first device group (the optical fingerprint sensing devices are shown as small rectangles in FIG. 5, all of them are not marked). And a row and a column farthest from the point-shaped back light source 120 include optical fingerprint sensing devices s1x in the x device group. And, an area of the optical fingerprint sensing devices s11 in the first device group is the smallest, which means an effective photosensitive area of the optical fingerprint sensing devices of the first device group is the smallest. An area of the optical fingerprint sensing devices s1x in the x device group is the largest, which means an effective photosensitive area of the optical fingerprint sensing devices is the largest. The reason is that an effective photosensitive area of the optical fingerprint sensing devices in the $y^{th}$ device group is smaller than an effective photosensitive area of the optical fingerprint sensing devices in the $(y+1)^{th}$ device group.

It should be noted that, in some embodiments, an effective photosensitive area of the optical fingerprint sensing devices in two adjacent device groups may have a linear variation relationship besides a size relationship described above. For example, the effective photosensitive area of the optical fingerprint sensing devices in the $y^{th}$ device group may be C times of an effective photosensitive area of the optical fingerprint sensing devices in the $(y+1)^{th}$ device group (C is within a range from 0 to 1). In some embodiments, an effective photosensitive area of the optical fingerprint sensing devices in two adjacent device groups may have other relationships besides the size relationship described above. For example, the effective photosensitive area of the optical fingerprint sensing devices in the $y^{th}$ device group and the effective photosensitive area of the optical fingerprint sensing devices in the $(y+1)^{th}$ device group may correspond to ordinates of two different points on a conic curve (e.g., parabola) (corresponding abscissas is y and y+1).

Figure 6:
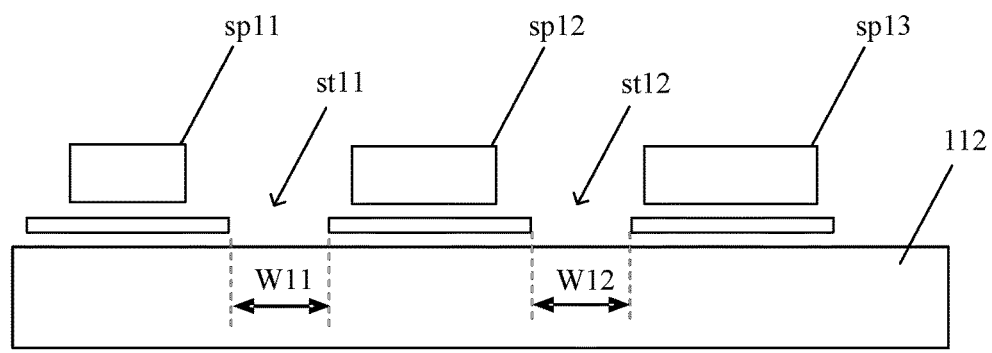
FIG. 6 is a cross-sectional view of a portion of the self-luminous display pixels in FIG. 5.

FIG. 6 is a cross-sectional view of a portion of the self-luminous display pixels in FIG. 5. A structure shown in the cross-sectional view is cut among three self-luminous display pixels, and the point-shaped back light source 120 and the second substrate 112 of the self-luminous display panel (the self-luminous display panel may be a non-opaque substrate) are illustrated. The three self-luminous display pixels include an optical fingerprint sensing devices sp11, an optical fingerprint sensing device sp12, and an optical fingerprint sensing device sp12, all of which are disposed at an opaque layer (not marked). A non-opaque area may be disposed between different opaque layers, for example, FIG. 6 illustrates a non-opaque area st11 and a non-opaque area st12. In the first kind of situation, areas of non-opaque areas in the self-luminous display pixels are the same, and as shown in FIG. 6, width W11 of the non-opaque area st11 and width W12 of the non-opaque area st12 are the same.

As shown in FIG. 6, in the first kind of situation, when it is in the first condition, an effective photosensitive area of the optical fingerprint sensing devices in the $y^{th}$ device group may be smaller than an effective photosensitive area of the optical fingerprint sensing devices in the $(y+1)^{th}$ device group, and the device photosensitive area is equal to the effective photosensitive area, so as to make the effective photosensitive area of the optical fingerprint sensing devices in the $y^{th}$ device group be smaller than the effective photosensitive area of the optical fingerprint sensing devices in the (y+1) device group. In other word, in the first condition, the device photosensitive area of the optical fingerprint sensing devices is not blocked by other structure, and the device photosensitive area is equal to the effective photosensitive area, and thus differences among a plurality of device photosensitive areas of the optical fingerprint sensing devices resulting in differences among a plurality of effective photosensitive areas.

In the present embodiment, optical fingerprint sensing devices disposed at different positions with different effective photosensitive areas make the optical fingerprint sensing devices in different device groups receive similar fingerprint signals. A reason is that, a point-shaped back light source is used to capture a fingerprint image in the present embodiment, and intensity of light emitted from the point-shaped back light source (for example, LED) gradually decreases as the emitting distance increases, and thus if the point-shaped back light source is used as a light source, intensity of light reaching various positions of the optical fingerprint sensing area are different. The farther from the point-shaped back light source, the weaker the intensity of light received by an optical fingerprint sensing device. Dotted lines shown in FIG. 4 are corresponding isophote lines, and the closer to the point-shaped back light source 120, the stronger the corresponding intensity of light. In the present embodiment, based on adjusting methods described above, the effective photosensitive areas of the optical fingerprint sensing devices in different device groups may be different. Specifically, the farther an optical fingerprint sensing device from the point-shaped back light source 120, the larger the effective photosensitive area of the optical fingerprint sensing device. Therefore a regular of variation of the effective photosensitive areas is contrary to a regular of variation of intensity of light, to ensure product of both are similar, and to further ensure the optical fingerprint sensing device disposed at different positions can receive similar fingerprint signals, thereby improving quality of a fingerprint image captured by the display module.

To further illustrating the reason referred above, assuming that intensity of incident light received by an optical fingerprint sensing device in a self-luminous display pixel is d, and an equivalent optical absorption rate of the fingerprint sensing device in the self-luminous display pixel is o, where the equivalent optical absorption rate o is proportional to the effective photosensitive area, fingerprint information finally obtained by the self-luminous display pixel is equal to a product of the intensity d of the incident light and the equivalent optical absorption rate o.

Under the condition that each of the self-luminous display pixels has the same area of the non-opaque area, the farther a self-luminous display pixel from the point-shaped back light source, the weaker the intensity of incident light d it received. Therefore, in the first kind of situation, the farther an optical fingerprint sensing device from the point-shaped back light source, the larger an effective photosensitive area it has, so that the farther the optical fingerprint sensing device from the point-shaped back light source, the larger the equivalent optical absorption rate o it has. With such arrangement, a product of an incident light intensity d and an equivalent optical absorption rate o of each of the optical fingerprint sensing devices may be similar, that is, the optical fingerprint sensing devices disposed at different positions may capture similar fingerprint information.

It should be noted that, for a self-luminous display pixel, its optical fingerprint sensing device may receive an incident light not from the point-shaped back light source through its own non-opaque area, but from a light emitted from the point-shaped back light source through a non-opaque area of another self-luminous display pixel, and the another self-luminous display pixel may be closer to the point-shaped back light source. That is, according to the description of the present embodiment, an incident light emitted from the point-shaped back light source enters to an device layer at an acute angle, and then the incident light is reflected from the top of an device layer and illuminated to another self-luminous display pixel disposed with a certain offset distance. In other words, incident light received by the self-luminous display pixels comes from non-opaque areas of the other corresponding self-luminous display pixels disposed beyond a certain distance.

It should be noted that, in the present embodiment, the effective photosensitive areas of the optical fingerprint sensing devices are adjusted by device groups, for example, in the first kind of situation, optical fingerprint sensing devices in a same device group may have the same effective photosensitive area. However, even the self-luminous display pixels in a same device group, intensity of incident light received by each of them is slightly different, thus herein a simplified process is applied, considering the optical fingerprint sensing devices in a same device group may receive incident light with similar intensity.

In summary, in the first kind of situation, device photosensitive areas of a optical fingerprint sensing devices in different device groups are adjusted to adjust effective photosensitive areas of the optical fingerprint sensing devices in various device groups, and further to adjust equivalent optical absorption rate o of each of the optical fingerprint sensing devices. By adjusting device photosensitive areas of optical fingerprint sensing devices, equivalent optical absorption rate o of each of the optical fingerprint sensing devices is adjusted to make the self-luminous display pixels (or the optical fingerprint sensing devices) disposed at different positions receive similar fingerprint signals.

FIG. 7 a schematic diagram of a top view of an optical fingerprint sensing area in a second situation according to one embodiment of the present disclosure, the top view of an optical fingerprint sensing area R2 is a rectangle. In the second kind of situation, in the optical fingerprint sensing area S2, a largest square region S2 which is closest to the point-shaped back light source 120 is selected. In the second kind of situation, there are two cases, the largest square region S2 may include 2x×2x optical fingerprint sensing devices, or the largest square region S2 may include (2x+1)×(2x+1) optical fingerprint sensing devices, and in the two cases x may be an integer greater than 2.

In the second kind of situation, in the largest square region S2 selected with the same method of the first kind of situation, device groups are set from $1^{st}$ to $x^{th}$. Similarly, in the second kind of situation, the optical fingerprint sensing devices in a $y^{th}$ device group and a $(y+1)^{th}$ device group may satisfy at least one of the following two conditions, wherein y may be an integer from 1 to x. In a first condition, an effective photosensitive area of the optical fingerprint sensing devices in the $y^{th}$ device group may be smaller than an effective photosensitive area of the optical fingerprint sensing devices in the $(y+1)^{th}$ device group. In a second condition, an area of the non-opaque area around the optical fingerprint sensing devices in the $y^{th}$ device group may be smaller than an area of the non-opaque area around the optical fingerprint sensing devices in the $(y+1)^{th}$ device group.

Referring to FIG. 7, besides the largest square region S2, in one optical fingerprint sensing area R2, 2a columns of the optical fingerprint sensing devices symmetrically disposed at both opposite sides of the largest square region S2 are remained (columns of the optical fingerprint sensing devices are represented with long vertical lines on right and left sides in FIG. 7), where a may be an integer no less than 1 (in FIG. 7, there are three columns on the left and right sides respectively, and thus a is equal to 3.) Among the 2a columns of the optical fingerprint sensing devices, two columns of the optical fingerprint sensing devices closest to the point-shaped back light source 120 are set as an $(x+1)^{th}$ device group, and other optical fingerprint sensing devices are set in a same manner, until two columns of the optical fingerprint sensing devices furthest from the point-shaped back light source 120 are set as an $(x+a)^{th}$ device group. At least one of the following two conditions may be satisfied among the optical fingerprint sensing devices in a $z^{th}$ device group and the optical fingerprint sensing devices in a $(z+1)^{th}$ device group, where z may be an integer from x to x+a: in a first condition, an effective photosensitive area of the optical fingerprint sensing devices in the $z^{th}$ device group may be smaller than an effective photosensitive area of the optical fingerprint sensing devices in the $(z+1)^{th}$ device group. In a second condition, an area of the non-opaque area around the optical fingerprint sensing devices in the $z^{th}$ device group may be smaller than an area of the non-opaque area around the optical fingerprint sensing devices in the $(z+1)^{th}$ device group.

It should be noted that, in the second kind of situation, relationships of effective photosensitive areas of the optical fingerprint sensing devices from an $x^{th}$ device group to an $(x+a)^{th}$ device group may be the same with relationships of effective photosensitive areas of the optical fingerprint sensing devices from a first device group to an $x^{th}$ device group, or may be different with relationships of effective photosensitive areas of the optical fingerprint sensing devices from a first device group to an $x^{th}$ device group.

Figure 8:
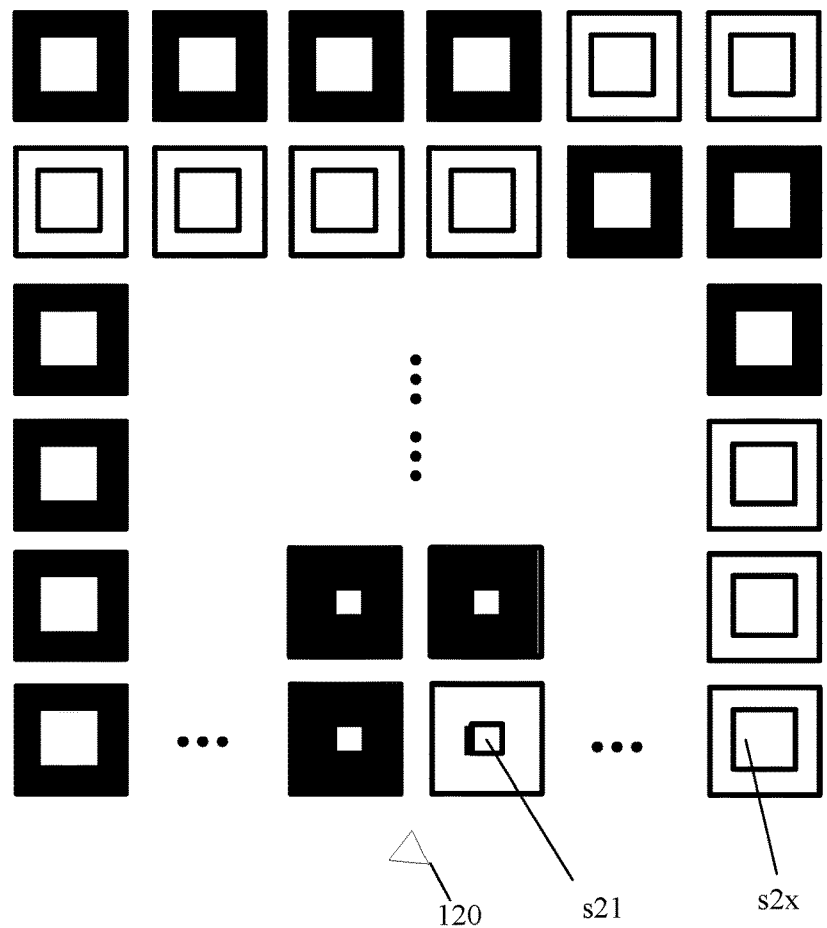
FIG. 8 is a schematic diagram of self-luminous display pixels in the second situation satisfying a second condition according to one embodiment of the present disclosure.

FIG. 8 is a schematic diagram of self-luminous display pixels in the second situation satisfying a second condition according to one embodiment of the present disclosure, and the self-luminous display pixels are arranged in rows and columns (in FIG. 8, the self-luminous display pixels are not marked, and sizes of the self-luminous display pixels are the same), and FIG. 8 exhibits two rows and two columns of the self-luminous display pixels farthest from the point-shaped back light source 120 as well as four self-luminous display pixels closest to the point-shaped back light source 120 (four self-luminous display pixels are arranged in two rows and two columns) in the largest square region S2, dots in FIG. 8 represents a portion of self-luminous display pixels omitted. Two self-luminous display pixels closest to the point-shaped back light source 120 include optical fingerprint sensing devices S21 in a first device group (the optical fingerprint sensing devices are shown as small rectangles in FIG. 8, not all of them are marked). Columns and rows of self-luminous display pixels farthest from the point-shaped back light source 120 include optical fingerprint sensing devices s2x in the $x^{th}$ device group. And an area of the optical fingerprint sensing devices s2x in the first device group is the smallest, which means an effective photosensitive area of the optical fingerprint sensing devices s2x in the $x^{th}$ device group is the smallest. An area of the optical fingerprint sensing devices s2x in the $x^{th}$ device group are the largest, which means the effective photosensitive area of the optical fingerprint sensing devices s2x in the $x^{th}$ device group is the largest, the reason causing this is the satisfaction of the first condition, that is an effective photosensitive area of the optical fingerprint sensing devices in the $y^{th}$ device group may be smaller than an effective photosensitive area of the optical fingerprint sensing devices in the $(y+1)^{th}$ device group.

That is, FIG. 8 shows the first condition in the second kind of situation. And, being different with structures in FIG. 5, device photosensitive areas of the optical fingerprint sensing devices in FIG. 8 are the same; and a light-blocking layer is disposed above the optical fingerprint sensing devices (not marked in FIG. 8), the light-blocking layer is marked with diagonal stripes in FIG. 8, and further illustrations may refer to FIG. 9.

Figure 9:
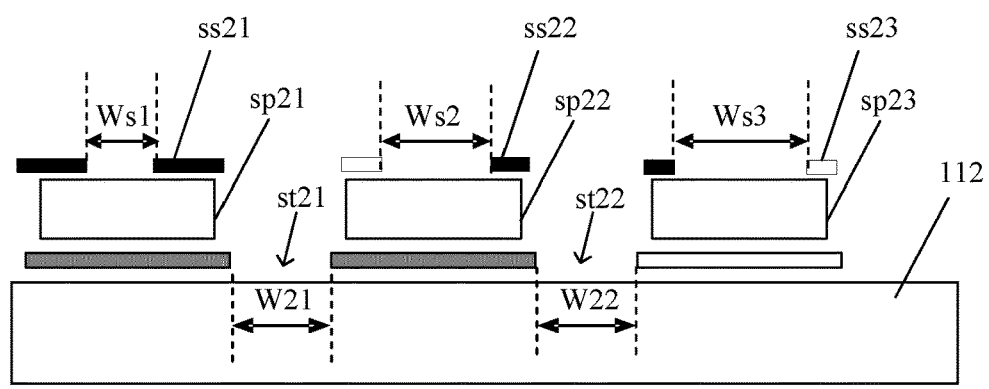
FIG. 9 is a schematic diagram of a portion of the self-luminous display pixels in FIG. 8.

FIG. 9 is a schematic diagram of a portion of the self-luminous display pixels in FIG. 8. A structure shown in the cross-sectional view is cut among three self-luminous display pixels and the second substrate 112 of the self-luminous display panel. The three self-luminous display pixels include an optical fingerprint sensing device sp21, an optical fingerprint sensing device sp22 and an optical fingerprint sensing device sp23. Respectively, the optical fingerprint sensing device sp21, the optical fingerprint sensing device sp22 and the optical fingerprint sensing device sp23 are disposed on an opaque layer (not marked). A non-opaque area may be disposed between different opaque layers, for example, FIG. 9 shows a non-opaque area st21 and a non-opaque area st22. In the second kind of situation, areas of non-opaque areas of the self-luminous display pixels are the same. And as shown in FIG. 9, width W21 of the non-opaque area st21 and width W22 of the non-opaque area st22 are the same.

In the optical fingerprint sensing area R2, a light-blocking layer is disposed above the optical fingerprint sensing devices. The light-blocking layer includes a plurality of openings for exposing surfaces of the optical fingerprint sensing devices, and sizes of the openings are various. Areas of openings of the light-blocking layer of the optical fingerprint sensing devices in the $y^{th}$ device group are smaller than areas of openings of the light-blocking layer of the optical fingerprint sensing devices in the $(y+1)^{th}$ device group, so as to make an effective photosensitive area of the optical fingerprint sensing devices in the $y^{th}$ device group be smaller than an effective photosensitive area of the optical fingerprint sensing devices in the $(y+1)^{th}$ device group. That is, if the device photosensitive areas of the optical fingerprint sensing devices are the same, the optical fingerprint sensing devices may have different effective photosensitive areas through adjusting a light-blocking layer with different openings.

Specifically, FIG. 9 shows that a light-blocking layer ss21 is disposed above the optical fingerprint sensing device sp21, a light-blocking layer ss22 is disposed above the optical fingerprint sensing device sp22, and a light-blocking layer ss23 is disposed above the optical fingerprint sensing device sp23. The light-blocking layer ss21, the light-blocking layer ss22 and the light-blocking layer ss23 include openings (not marked) for exposing surfaces of the light-blocking layer ss21, the light-blocking layer ss22 and the light-blocking layer ss23, respectively. And areas of the light-blocking layer ss21, the light-blocking layer ss22 and the light-blocking layer ss23 increase sequentially. As shown in the cross-sectional view of FIG. 9, width Ws1 is smaller than width Ws2, and the width Ws2 is smaller than width Ws3.

It should be noted that, in FIG. 7, the opaque layer disposed at bottom of the optical fingerprint sensing devices (sp21, sp22, or sp23) determines an area of the non-opaque area of the self-luminous display pixels (or an area of the opaque area), that is, a corresponding light-blocking layer (ss21, ss22 or ss23) is disposed in the opaque area disposed at the bottom of the self-luminous display pixels.

It should be noted that, each of the light-blocking layers may be a structure of one layer, or may be a structure of multiple layers. Each of the light-blocking layers may include one opening, or multiple openings. An overlooking view of each of the openings may be various shapes, such as polygons and circles, and each of the openings may be closed, or non-closed.

According to FIG. 7 to FIG. 9, by configuring light-blocking layers with different openings above the optical fingerprint sensing devices, the farther an device group from the point-shaped back light source 120, the larger effective photosensitive areas of the optical fingerprint sensing devices corresponding to the device group. Therefore, equivalent optical absorption rate o of each of the optical fingerprint sensing devices in different device groups may be adjusted. The closer to the point-shaped back light source 120, the stronger the corresponding intensity of incident light, which is just as the isophote lines shown in FIG. 7 with dotted lines. If light transmitting areas around the optical fingerprint sensing devices are the same, a distribution of intensities of incident light received by the optical fingerprint sensing devices may be consistent with a distribution of corresponding light. Therefore, in the second kind of situation, a regular of variation of the effective photosensitive areas of the optical fingerprint sensing devices in different device groups is contrary to a regular of variation of intensity of light exhibited in FIG. 7, so as to ensure products of the equivalent optical absorption rate o of the optical fingerprint sensing devices and intensity of incident light d are similar for each of the self-luminous display pixels in different device groups. As fingerprint signals are equal to products of intensity of incident light and equivalent optical absorption rate, the optical fingerprint sensing devices disposed at different positions receive similar fingerprint signals.

That is, through applying structures of FIG. 7 to FIG. 9, each of the optical fingerprint sensing devices may receive fingerprint signals with little differences and a similar level. And comparing with the optical fingerprint sensing devices in FIG. 6, each of the optical fingerprint sensing devices in FIG. 9 has similar structure and property (as described before, device photosensitive areas of the optical fingerprint sensing devices are the same), thus electron noises and leakage currents of the optical fingerprint sensing devices are similar (in such case, it has a convenience of following noise removal and other advantages), which is beneficial for capturing a fingerprint image with good quality.

FIG. 10 is a schematic diagram of a top view of an optical fingerprint sensing area in a third situation according to one embodiment of the present disclosure, and a top view of an optical fingerprint sensing area R3 is rectangle. In the third kind of situation, in the optical fingerprint sensing area R3, a largest square region S3 which is closest to the point-shaped back light source 120 is selected. In the second kind of situation, there are two cases, the largest square region S3 may include 2x×2x optical fingerprint sensing devices, or the largest square region S3 may include (2x+1)×(2x+1) optical fingerprint sensing devices, and x may be an integer greater than 2 in the two cases.

In the third kind of situation, in the largest square region S3 selected with the same method of the first kind of situation, device groups from a first device group to an $x^{th}$ device group are selected. Similarly, in the third kind of situation, the optical fingerprint sensing devices in a $y^{th}$ device group and a $(y+1)^{th}$ device group may satisfy at least one of the following two conditions, wherein y may be an integer from 1 to x. In a first condition, an effective photosensitive area of the optical fingerprint sensing devices in the $y^{th}$ device group may be smaller than an effective photosensitive area of the optical fingerprint sensing devices in the $(y+1)^{th}$ device group. In a second condition, an area of the non-opaque area around the optical fingerprint sensing devices in the $y^{th}$ device group may be smaller than an area of the non-opaque area around the optical fingerprint sensing devices in the $(y+1)^{th}$ device group.

Referring to FIG. 10, besides the largest square region S3, in one optical fingerprint sensing area R3, a columns of the optical fingerprint sensing devices symmetrically disposed outside of the largest square region S3 (each column of the optical fingerprint sensing devices is represented with a horizontal line), wherein a may be an integer no less than 1 (in FIG. 10, there are seven columns, and thus a is equal to 3). Among the a columns of the optical fingerprint sensing devices, two columns of the optical fingerprint sensing devices closest to the point-shaped back light source 120 are set as an $(x+1)^{th}$ device group, and other optical fingerprint sensing devices are set in a same manner, until two columns of the optical fingerprint sensing devices furthest from the point-shaped back light source 120 are set as an $(x+a)^{th}$ device group. At least one of the following two conditions may be satisfied among the optical fingerprint sensing devices in a $z^{th}$ device group and the optical fingerprint sensing devices in a $(z+1)^{th}$ device group, wherein z may be an integer from x to x+a: in a first condition, an effective photosensitive area of the optical fingerprint sensing devices of the $z^{th}$ device group may be smaller than an effective photosensitive area of the optical fingerprint sensing devices in the $(z+1)^{th}$ device group. In a second condition, an area of the non-opaque area around the optical fingerprint sensing devices in the $z^{th}$ device group may be smaller than an area of the non-opaque area around the optical fingerprint sensing devices in the $(z+1)^{th}$ device group.

It should be noted that, in the third kind of situation, relationships of effective photosensitive areas of the optical fingerprint sensing devices from an $x^{th}$ device group to an $(x+a)^{th}$ device group may be the same with relationships of effective photosensitive areas of the optical fingerprint sensing devices from a first device group to an $x^{th}$ device group, or may be different with relationships of effective photosensitive areas of the optical fingerprint sensing devices from a first device group to an $x^{th}$ device group.

Figure 11:
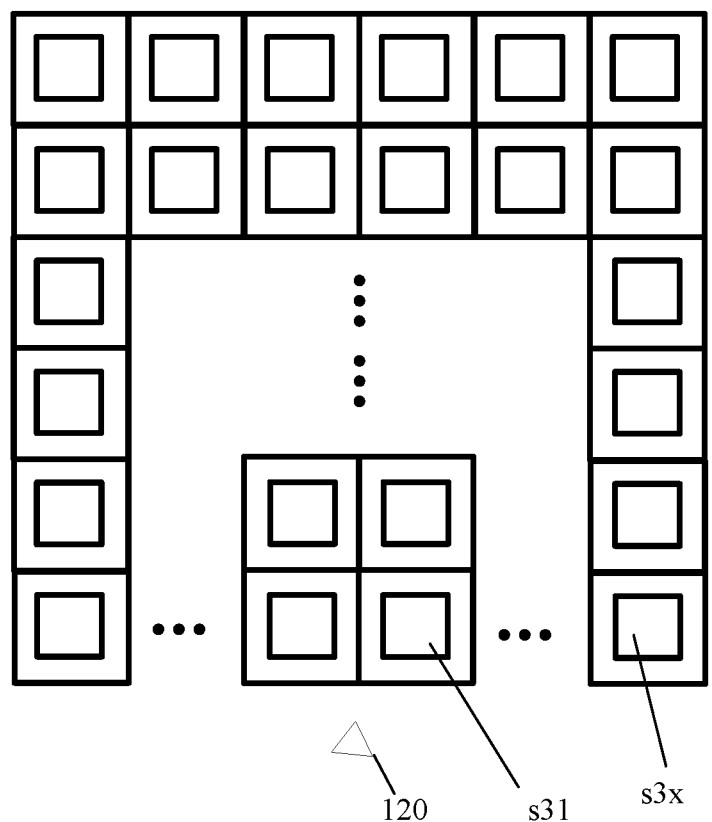
FIG. 11 is a schematic diagram of self-luminous display pixels in the third situation satisfying a second condition according to one embodiment of the present disclosure.

FIG. 11 is a schematic diagram of self-luminous display pixels in the third situation satisfying a second condition according to one embodiment of the present disclosure, and the self-luminous display pixels are arranged in rows and columns (in FIG. 11, the self-luminous display pixels are not marked), FIG. 11 exhibits two rows and two columns of the self-luminous display pixels farthest from the point-shaped back light source 120 as well as four self-luminous display pixels closest to the point-shaped back light source 120 (four self-luminous display pixels are arranged in two rows and two columns) in the largest square region S3, and dots in FIG. 8 represents a portion of self-luminous display pixels omitted. The self-luminous display pixels shown in FIG. 11 have same sizes (the self-luminous display pixels are represented with larger rectangles in FIG. 11, they are not marked). Two self-luminous display pixels closest to the point-shaped back light source 120 include optical fingerprint sensing devices S31 in a first device group (the optical fingerprint sensing devices are shown as smaller rectangles in FIG. 11, not all of them are marked). Columns and rows of self-luminous display pixels farthest from the point-shaped back light source 120 include optical fingerprint sensing devices s3x in the $x^{th}$ device group. And areas of the optical fingerprint sensing devices s2x in the first device group are the smallest, which means effective photosensitive areas of the optical fingerprint sensing devices s2x in the $x^{th}$ device group are the smallest. FIG. 11 exhibits a structure of the self-luminous display pixels of the second condition in the third kind of situation. As shown in FIG. 11, device photosensitive areas of the optical fingerprint sensing devices are the same, but different self-luminous display pixels have different device photosensitive areas, further descriptions may refer to FIG. 12.

Figure 12:
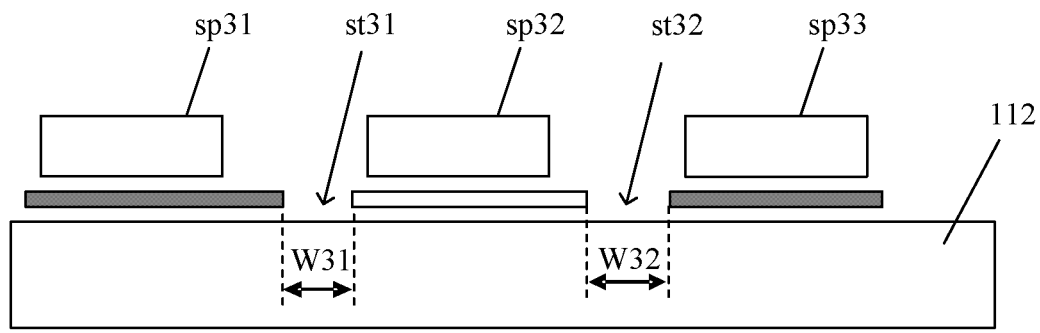
FIG. 12 is a schematic diagram of a cross-sectional view of a portion of the self-luminous display pixels in FIG. 11.

FIG. 12 is a schematic diagram of a cross-sectional view of a portion of the self-luminous display pixels in FIG. 11. A structure shown in the cross-sectional view is cut among three self-luminous display pixels. The three self-luminous display pixels include an optical fingerprint sensing device sp31, an optical fingerprint sensing device sp32 and an optical fingerprint sensing device sp33, respectively. The three self-luminous display pixels are disposed on an opaque layer (not marked). A non-opaque area may be disposed between different opaque layers. For example, FIG. 12 shows a non-opaque area st31 and a non-opaque area st32.

As described before, non-opaque areas of the self-luminous display pixels may be determined by opaque layers deposed below the optical fingerprint sensing devices. In the present embodiment, areas of different non-opaque areas may be adjusted by configuring areas of the opaque layers.

As shown in FIG. 12, by adjusting areas of the non-opaque areas, areas of the non-opaque areas around the optical fingerprint sensing devices in the $y^{th}$ device group may be smaller than areas of the non-opaque areas around the optical fingerprint sensing devices in the $(y+1)^{th}$ device group. As structures shown in FIG. 12 are cross-sectional views, width W31 of the non-opaque area st31 being smaller than width W32 of the non-opaque area st32 represents areas of the non-opaque areas around the optical fingerprint sensing devices in the $y^{th}$ device group being smaller than areas of the non-opaque areas around the optical fingerprint sensing devices in the $(y+1)^{th}$ device group As already mentioned, in the second condition, (FIG. 11 and FIG. 12 have exhibited) device photosensitive areas of the optical fingerprint sensing devices in various device groups are the same. As being specifically shown in the figures, the optical fingerprint sensing device sp31, the optical fingerprint sensing device sp32 and the optical fingerprint sensing device sp33 have the same sizes, thus device photosensitive areas of the three self-luminous display pixels are the same.

As dotted lines representing a portion of isophote lines shown in FIG. 10, the farther to the point-shaped back light source 120, the weaker the corresponding intensity of light. As shown in FIG. 12, a regular of variation of non-opaque areas of the self-luminous display pixels is contrary to a regular of variation of intensity of light exhibited in FIG. 10. Therefore, according to FIG. 10 to FIG. 12, in the third kind of situation, by setting the farther the optical fingerprint sensing devices from the point-shaped back light source 120, the larger corresponding non-opaque areas (specifically, an device group is set as an unit, and the self-luminous display pixels containing the optical fingerprint sensing devices have non-opaque areas), so as to make various of the optical fingerprint sensing devices have similar intensity d of incident light. And, in the third kind of situation, the effective photosensitive areas of the optical fingerprint sensing devices are the same, thus the equivalent optical absorption rate o of the optical fingerprint sensing devices are equal. Finally, products of the equivalent optical absorption rate o and the intensity of incident light of the optical fingerprint sensing devices are similar. Therefore, each of the optical fingerprint sensing devices may receive fingerprint signals with little differences and a same level.

Comparing with the optical fingerprint sensing devices in FIG. 6, each of the optical fingerprint sensing devices in FIG. 12 has similar structure and property (as described before, device photosensitive areas of the optical fingerprint sensing devices are the same), thus electron noises and leakage currents of the optical fingerprint sensing devices are similar (in such case, it has a convenience of following noise removal and other advantages), which is beneficial for capturing a fingerprint image with good quality.

It should be noted that, in the third kind of situation, the reason of intensity of incident light d of the optical fingerprint sensing devices being similar is that, different self-luminous display pixels have different non-opaque areas, being just corresponding to a property that the farther from the point-shaped back light source 120, the weaker the intensity of incident light is. And light passing through an device layer and being reflected from a top of the device layer, results in intensities of incident light reaching the optical fingerprint sensing devices are similar.

In the third kind of situation, the optical fingerprint sensing devices are arranged in rows and columns, and the point-shaped back light source 120 is disposed obliquely below an outermost row of the optical fingerprint sensing devices in the optical fingerprint sensing area. Therefore, the largest square region is selected uniquely.

Figure 13:
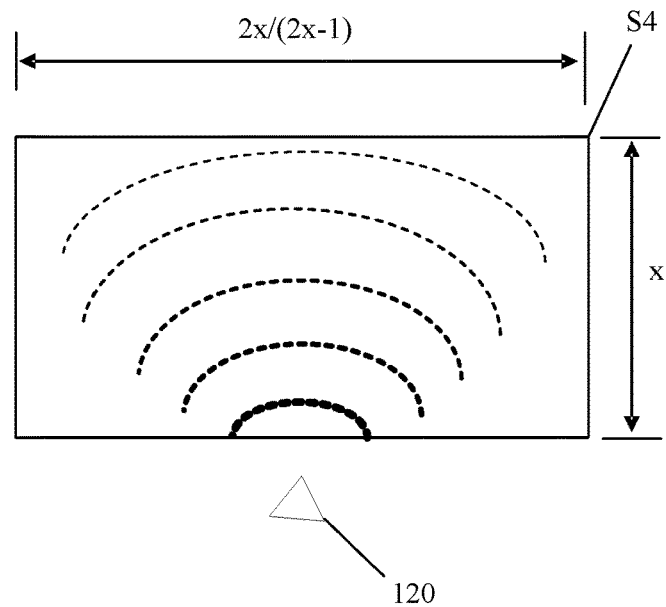
FIG. 13 is a schematic diagram of a top view of an optical fingerprint sensing area in a fourth situation according to one embodiment of the present disclosure.

FIG. 13 is a schematic diagram of a top view of an optical fingerprint sensing area in a fourth situation according to one embodiment of the present disclosure. In the fourth situation, a top view of an optical fingerprint sensing area is rectangle, and the optical fingerprint sensing area includes x×(2x−1) optical fingerprint sensing devices, specifically, the optical fingerprint sensing area may include x rows and (2x−1) columns; or the optical fingerprint sensing area includes x×2x optical fingerprint sensing devices, specifically, the optical fingerprint sensing area includes x rows and 2x columns. And x may be an integer greater than 2.

In the fourth kind of situation, in the optical fingerprint sensing area, a largest rectangle region S4 closest to the point-shaped back light source 120 is selected. And the largest rectangle region S4 is the optical fingerprint sensing area itself. Specifically, if the optical fingerprint sensing area includes x×(2x−1) optical fingerprint sensing devices, the largest rectangle region S4 includes x×(2x−1) optical fingerprint sensing devices; and if the optical fingerprint sensing area includes x×2x optical fingerprint sensing devices, the largest rectangle region S4 includes x×2x optical fingerprint sensing devices.

In the fourth kind of situation, in the largest rectangle region S4 selected as described above, one row and two columns of the optical fingerprint sensing devices furthest from the point-shaped back light source 120 are set as an $x^{th}$ device group, and one row and two columns of the optical fingerprint sensing devices that are the secondly furthest from the point-shaped back light source are set as an $(x-1)^{th}$ device group, other optical fingerprint sensing devices are set in a same manner, until remained optical fingerprint sensing devices are set as a first device group.

Further, in the fourth kind of situation, at least one of the following two conditions may be satisfied among the optical fingerprint sensing devices in a $y^{th}$ device group and the optical fingerprint sensing devices in a $(y+1)^{th}$ device group, where y may be an integer from 1 to x. In a first condition, an effective photosensitive area of the optical fingerprint sensing devices in the $y^{th}$ device group may be smaller than an effective photosensitive area of the optical fingerprint sensing devices in the $(y+1)^{th}$ device group. In a second condition, an area of the non-opaque area around the optical fingerprint sensing devices in the $y^{th}$ device group may be smaller than an area of the non-opaque area around the optical fingerprint sensing devices in the $(y+1)^{th}$ device group.

As shown in FIG. 13, in the fourth kind of situation, a selection of the first condition or the second condition for the optical fingerprint sensing devices in the $y^{th}$ device group or the optical fingerprint sensing devices in the $(y+1)^{th}$ device group, and corresponding structures and properties for the self-luminous display pixels and the optical fingerprint sensing devices corresponding to the selection may be referred to related description of FIG. 5 and FIG. 6, or FIG. 8 and FIG. 9, or FIG. 11 and FIG. 12.

Figure 14:
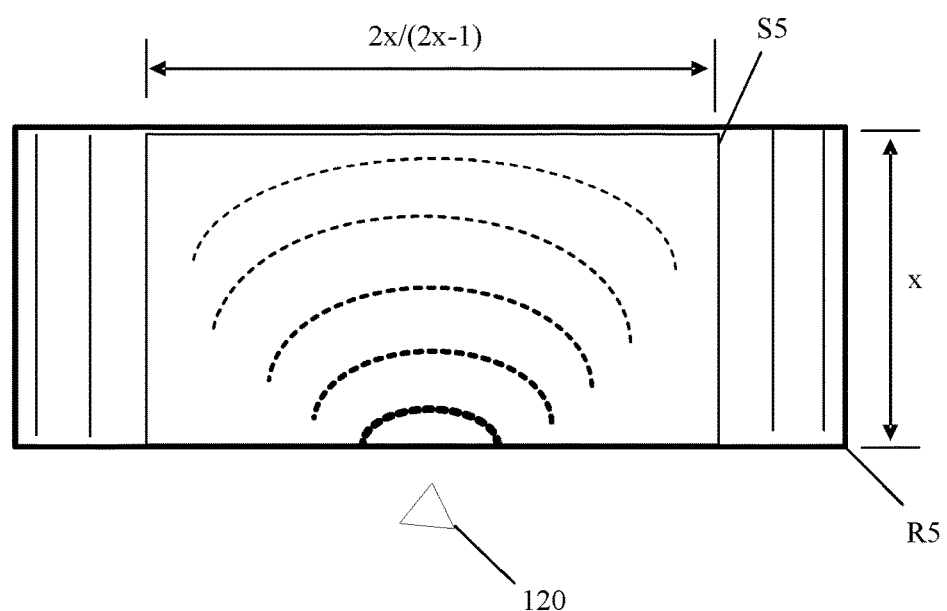
FIG. 14 is a schematic diagram of a top view of an optical fingerprint sensing area in a fifth situation according to one embodiment of the present disclosure.

FIG. 14 is a schematic diagram of a top view of an optical fingerprint sensing area in a fifth situation according to one embodiment of the present disclosure. As shown in FIG. 14, a top view of an optical fingerprint sensing area R5 is rectangle. In the fifth kind of situation, in the optical fingerprint sensing area R5, a largest rectangle region S5 closest to the point-shaped back light source 120 is selected. And there are two cases, the largest rectangle region S5 may include x×(2x−1) optical fingerprint sensing devices, specifically, x rows and (2x−1) columns; or the largest rectangle region S5 may include x×2x optical fingerprint sensing devices, specifically, x rows and 2x columns, and x may be an integer greater than 2.

In the fifth kind of situation, in the largest rectangle region S5 selected with the same method of the fourth kind of situation, device groups are set from a $1^{th}$ device group to an $x^{th}$ device group. Similarly, in the fifth kind of situation, the optical fingerprint sensing devices in a $y^{th}$ device group and a $(y+1)^{th}$ device group may satisfy at least one of the following two conditions, where y may be an integer from 1 to x. In a first condition, an effective photosensitive area of the optical fingerprint sensing devices of the $y^{th}$ device group may be smaller than an effective photosensitive area of the optical fingerprint sensing devices in the $(y+1)^{th}$ device group. In a second condition, an area of the non-opaque area around the optical fingerprint sensing devices in the $y^{th}$ device group may be smaller than an area of the non-opaque area around the optical fingerprint sensing devices in the $(y+1)^{th}$ device group.

Referring to FIG. 14, besides the largest rectangle region S5, in one optical fingerprint sensing area R5, 2a columns of the optical fingerprint sensing devices symmetrically disposed at both opposite sides of the largest rectangle region S5 are remained (columns of the optical fingerprint sensing devices are represented with long vertical lines on right and left sides in FIG. 14), where a may be an integer no less than 1 (in FIG. 14, there are two columns on the left and right sides respectively, thus a is equal to 2). Among the 2a columns of the optical fingerprint sensing devices, two columns of the optical fingerprint sensing devices closest to the point-shaped back light source 120 are set as an $(x+1)^{th}$ device group, and other optical fingerprint sensing devices are set in a same manner, until two columns of the optical fingerprint sensing devices furthest from the point-shaped back light source 120 are as an $(x+a)^{th}$ device group. At least one of the following two conditions may be satisfied among the optical fingerprint sensing devices in a $z^{th}$ device group and the optical fingerprint sensing devices in a $(z+1)^{th}$ device group, where z may be any integer from x to x+a: in a first condition, an effective photosensitive area of the optical fingerprint sensing devices in the $z^{th}$ device group may be smaller than an effective photosensitive area of the optical fingerprint sensing devices in the $(z+1)^{th}$ device group. In a second condition, the area of the non-opaque area around the optical fingerprint sensing devices in the $z^{th}$ device group may be smaller than the area of the non-opaque area around the optical fingerprint sensing devices in the $(z+1)^{th}$ device group.

It should be noted that, in the fifth kind of situation, relationships of effective photosensitive areas of the optical fingerprint sensing devices from an $x^{th}$ device group to an $(x+a)^{th}$ device group may be the same with relationships of effective photosensitive areas of the optical fingerprint sensing devices from a first device group to an $x^{th}$ device group, or may be different with relationships of effective photosensitive areas of the optical fingerprint sensing devices from a first device group to an $x^{th}$ device group.

As shown in FIG. 14, in the fifth kind of situation, a selection of the first condition or the second condition for the optical fingerprint sensing devices in the $y^{th}$ device group or the optical fingerprint sensing devices in the $(y+1)^{th}$ device group, corresponding structures and properties of the self-luminous display pixels and the optical fingerprint sensing devices corresponding to the selection may be determined by referring to related description of FIG. 5 and FIG. 6, or FIG. 8 and FIG. 9, or FIG. 11 and FIG. 12.

Figure 15:
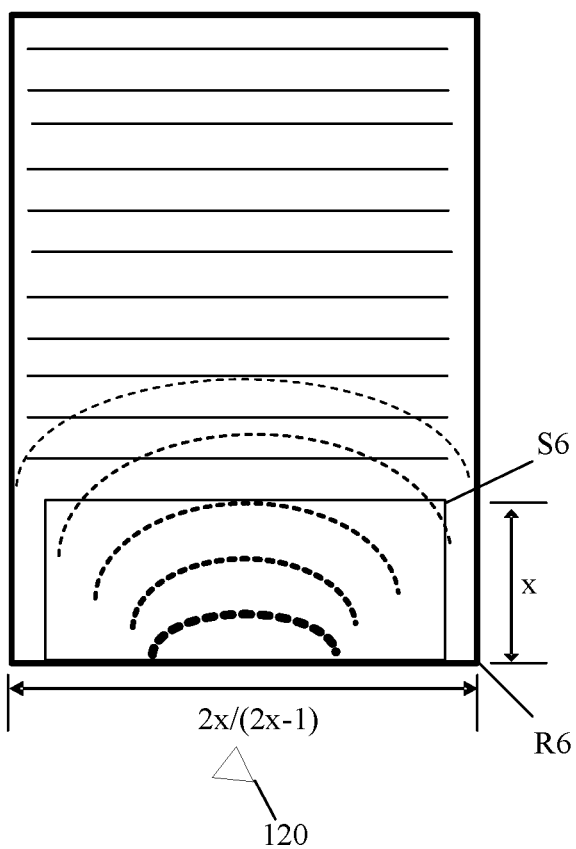
FIG. 15 is a schematic diagram of a top view of an optical fingerprint sensing area in a sixth situation according to one embodiment of the present disclosure.

FIG. 15 is a schematic diagram of a top view of an optical fingerprint sensing area in a sixth situation according to one embodiment of the present disclosure. As shown in FIG. 15, a top view of the optical fingerprint sensing area R6 is rectangle. In the sixth kind of situation, in the optical fingerprint sensing area R6, a largest rectangle region S6 closest to the point-shaped back light source 120 is selected. And there are two cases, the largest rectangle region S6 may include x×(2x−1) optical fingerprint sensing devices, specifically, x rows and (2x−1) columns; or the largest rectangle region S6 may include x×2x optical fingerprint sensing devices, specifically, x rows and 2x columns. And x may be an integer greater than 2.

In the sixth kind of situation, in the largest rectangle region S5 selected with the same method of the fourth kind of situation, device groups are set from a $1^{st}$ device group to an $x^{th}$ device group. Similarly, in the fifth kind of situation, the optical fingerprint sensing devices in a $y^{th}$ device group and a $(y+1)^{th}$ device group may satisfy at least one of the following two conditions, where y may be an integer from 1 to x. In a first condition, an effective photosensitive area of the optical fingerprint sensing devices in the y device group may be smaller than an effective photosensitive area of the optical fingerprint sensing devices in the $(y+1)^{th}$ device group. In a second condition, an area of the non-opaque area around the optical fingerprint sensing devices in the $y^{th}$ device group may be smaller than an area of the non-opaque area around the optical fingerprint sensing devices in the $(y+1)^{th}$ device group.

Referring to FIG. 15, besides the largest rectangle region S6, in one optical fingerprint sensing area R6, a columns of the optical fingerprint sensing devices disposed at an outside of the largest rectangle region S6 are remained (columns of the optical fingerprint sensing devices are represented with horizontal lines in FIG. 15), where a may be an integer no less than 1 (in FIG. 15, there are still eleven columns, thus a is equal to 11). Among the a columns of the optical fingerprint sensing devices, one column of the optical fingerprint sensing devices closest to the point-shaped back light source 120 are set as an $(x+1)^{th}$ device group, and other optical fingerprint sensing devices are set in a same manner, until one column of the optical fingerprint sensing devices furthest from the point-shaped back light source 120 are set as an $(x+a)^{th}$ device group. At least one of the following two conditions may be satisfied among the optical fingerprint sensing devices in a z device group and the optical fingerprint sensing devices in a $(z+1)^{th}$ device group, where z may be any integer from x to x+a: in a first condition, an effective photosensitive area of the optical fingerprint sensing devices in the $z^{th}$ device group may be smaller than an effective photosensitive area of the optical fingerprint sensing devices in the $(z+1)^{th}$ device group. In a second condition, the area of the non-opaque area around the optical fingerprint sensing devices in the $z^{th}$ device group may be smaller than the area of the non-opaque area around the optical fingerprint sensing devices in the $(z+1)^{th}$ device group.

It should be noted that, in the sixth kind of situation, relationships of effective photosensitive areas of the optical fingerprint sensing devices from an $x^{th}$ device group to an $(x+a)^{th}$ device group may be the same with relationships of effective photosensitive areas of the optical fingerprint sensing devices from a first device group to an $x^{th}$ device group, or may be different with relationships of effective photosensitive areas of the optical fingerprint sensing devices from a first device group to an $x^{th}$ device group.

As shown in FIG. 15, in the sixth kind of situation, a selection of the first condition or the second condition for the optical fingerprint sensing devices in the $y^{th}$ device group or the optical fingerprint sensing devices in the $(y+1)^{th}$ device group, and corresponding structures and properties of the self-luminous display pixels and the optical fingerprint sensing devices corresponding to the selection may be determined by referring to related description of FIG. 5 and FIG. 6, or FIG. 8 and FIG. 9, or FIG. 11 and FIG. 12.

For the fourth kind of situation of the sixth kind of situation, the optical fingerprint sensing devices are arranged in rows and columns, and the point-shaped back light source 120 is disposed obliquely below an outermost row of the optical fingerprint sensing devices in the optical fingerprint sensing area. And a distance between a center of the largest rectangle region and a center of the point-shaped back light source 120 is the shortest. Therefore, the largest rectangle region is selected uniquely.

In the present embodiment, it is necessary to guarantee a distance between a center of the largest square region (may refer to the largest square region S1 in the first kind of situation, the largest square region S2 in the second kind of situation and the largest rectangle region S3 in the third kind of situation) and the point-shaped back light source 120 is the shortest, or guarantee a distance between a center of the largest rectangle region (may refer to the largest rectangle region S4 in the fourth kind of situation, the largest rectangle region S5 in the fifth kind of situation, or the largest rectangle region S6 in the sixth kind of situation) and the point-shaped back light source 120 is the shortest. Therefore, in the actual implement, alignment of the point-shaped back light source 120 should be accurate. On the contrary, if the alignment is not accurate, distribution of intensity of light emitted from the point-shaped back light source 120 may deviate from an expected distribution of intensities of light, resulting in a failure to achieve corresponding technical effect; that is, the optical fingerprint sensing devices disposed at different positions may not receive fingerprint signals with similar strengths.

According to six kinds of situations described above, in the present embodiments, the optical fingerprint sensing devices are grouped and structures of the optical fingerprint sensing devices in different device groups are configured according to different conditions (each of the six kinds of situations may be set to at least one of two conditions) to make the optical fingerprint sensing devices receive similar fingerprint signals, thus improving quality of a captured fingerprint image.

Another embodiment of the present disclosure provides a display module.

Figure 16:
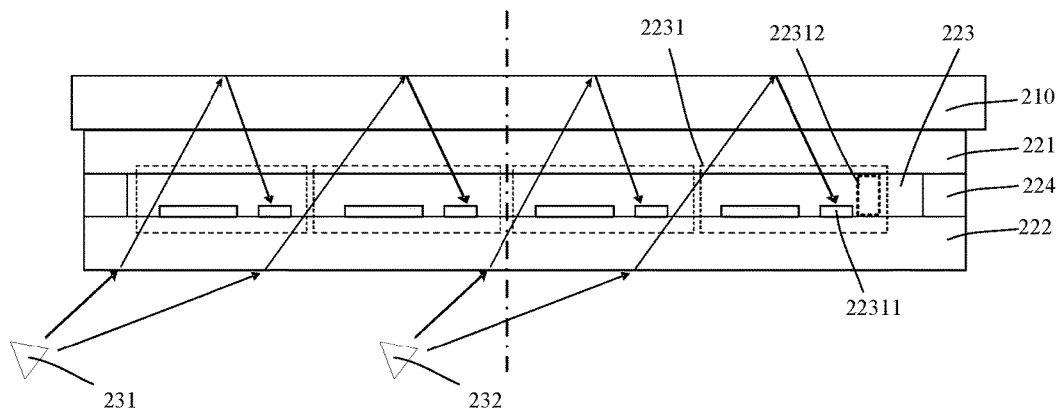
FIG. 16 is a schematic diagram of a cross-sectional view of a display module according to one embodiment of the present disclosure.

FIG. 16 is a schematic diagram of a cross-sectional view of a display module according to one embodiment of the present disclosure, most of structures of the display module are the same as structures described in former embodiments, and may refer to descriptions of the former embodiments.

A shown in FIG. 16, the display module includes a self-luminous display panel, and the self-luminous display panel includes a first substrate 221, a second substrate 222 and a self-luminous circuit layer 223. The self-luminous circuit layer 223 is disposed between the first substrate 221 and the second substrate 222. The self-luminous display panel may include a sealing structure 224. The sealing structure 224 is disposed between the first substrate 221 and the second substrate 222. The sealing structure 224 may seal the self-luminous circuit layer 223 between the first substrate 221 and the second substrate 222 by cooperating with the first substrate 221 and the second substrate 222. Elaborate information may refer to corresponding descriptions of former embodiments.

In the present embodiment, the self-luminous display panel includes two optical fingerprint sensing areas (not marked), as shown in FIG. 16, the two optical fingerprint sensing areas are distinguished with dot and dash lines. Two point-shaped back light sources corresponding to each of the two optical fingerprint sensing areas disposed obliquely below each of the two optical fingerprint sensing areas, and the two point-shaped back light sources are a point-shaped back light source 231 and a point-shaped back light source 232, respectively.

As shown in FIG. 16, each of the two optical fingerprint sensing areas includes two self-luminous display pixels 2231, which illustrates that the self-luminous circuit layer 223 includes multiple self-luminous display pixels. In FIG. 16, the self-luminous display pixels 2231 and relationships between adjacent self-luminous display pixels 2231 are exhibited in areas enclosed by dashed frames. Each of the self-luminous display pixels 2231 may include at least one opaque area (not marked) and one non-opaque area 22312, and FIG. 16 shows a non-opaque area 22312 (that is, one of non-opaque areas may be an area exhibited as an area enclosed by a smallest dashed frame in FIG. 16). Opaque areas of the self-luminous display pixels 2231 may include optical fingerprint sensing devices 22311. Elaborate information may refer to corresponding descriptions in former embodiments.

In the present embodiment, the display module may include a protective layer 210 disposed above the self-luminous display panel. For the presence of the protective layer 210, the first substrate 221 which bears direct finger pressing is replaced with the protective layer 210, and thus a process of passing through the protective layer 210 is added to a transmitting process of corresponding light (light emitted from the point-shaped back light source 231 and the point-shaped back light source 232 and corresponding reflected light are represented with black arrows in FIG. 16, and a portion of refractive light is omitted).

In the present embodiment, the self-luminous display panel is divided into multiple areas, the multiple areas include multiple optical fingerprint sensing areas, and different point-shaped back light sources are disposed in different areas. A touch function of the display module (that is, in the present embodiment, a touch function is integrated into the display module) is used to detect an pressing area of finger touching, and a point-shaped back light source disposed in a corresponding area and control circuits in a corresponding optical fingerprint sensing area are applied to capture corresponding fingerprint image signals.

It should be noted that, for a display module applied in an electronic product, such as a cell phone or a tablet PC, a display area of the display module may be much larger than one finger, and an area illuminated by each of the point-shaped back light source may be limited (for example, an area illuminated by a small LED is limited). Therefore, if the self-luminous display panel is divided into multiple areas, one point-shaped back light source may be applied to one optical fingerprint sensing area with a small area (for example, if an optical fingerprint sensing area with small area is pressed by a finger, light on a corresponding LED), thereby improving intensity of light emitted from a light source used for acquiring a fingerprint image. Besides, as described above, a principle of imaging of the present disclosure is making full use of the isotropic property of light emitted from a point-shaped back light source, so as to avoid an crosstalk between different light. If using LED as a point-shaped back light source, LED is not an ideal point-shaped back light source as a light emitting surface of LED has a certain area (especially for a LED illuminating by conversation of phosphor, such as LED emitted white light). The larger the light emitting surface is, the larger a proportion of an crosstalk came from light emitted from different light emitting points. Therefore, it is possible to place the LED away from the optical fingerprint sensing area to minimize the crosstalk.

And, fabrication of an LED with large illumination surface needs high cost and power consumption, as well as large volume. Thereby, smaller LED may be selected as a point-shaped back light source in the present embodiment. And the smaller the LED, the smaller area it radiates. Intensity of the point-shaped back light source is quadratic decay with a distance, thus if the distance is longer than a certain value, the intensity of the point-shaped back light source is not enough, thereby a fingerprint image with good quality may not be captured. For the reason described above, multiple LEDs may be set in different areas, and each illumination areas of the multiple LEDs may be partially covered with each other. And only one LED light may be allowed to turn on at one period, so as to avoid the crosstalk with other LED light. Besides, a structure of dividing the self-luminous display panel into multiple areas and multiple point-shaped back light sources may enable the multiple areas to drive corresponding fingerprint capture circuits individually, and thus may process fingerprint image capturing at multiple areas at a same time, so as to minus capturing time (due to process fingerprint image capturing at multiple small areas, the fingerprint image capturing time equal to fingerprint image capturing time of processing fingerprint image capturing at one small area, and fingerprint image capturing time of processing fingerprint image capturing at one small area is less than at one big area), and reduce power consumption.

More structures and properties on the display module provided in the present embodiment may be referred to the descriptions of former embodiments.

Similar with the former embodiments, the present embodiment continues to improve the optical fingerprint sensing devices disposed in the optical fingerprint sensing area by implementing different design on the optical fingerprint sensing devices, so as to make the optical fingerprint sensing devices be different with a certain regular.

Figure a schematic diagram of a top view of an optical fingerprint sensing area in the display module of FIG. 16, the optical fingerprint sensing area Rh corresponds to the point-shaped back light source 231. The top view of the optical fingerprint sensing area Rh is rectangle. In some embodiments, a top view of the optical fingerprint sensing area may be square.

In the present embodiment, optical fingerprint sensing areas are divided, and one optical fingerprint sensing area is sequentially divided according to a distance from the point-shaped back light source, from nearest to farthest, and from a first light intensity area to an $x^{th}$ light intensity area, and overall shapes of a second light intensity area to the $(x-1)^{th}$ light intensity area are arc stripes or elliptical arc stripes, and x may be an integer no less than 3. The optical fingerprint sensing devices in the first light intensity area are set as a first device group, the optical fingerprint sensing devices in the second light intensity area are set as a second device group, and other optical fingerprint sensing devices are set in a same manner, until set the optical fingerprint sensing devices in the $x^{th}$ light intensity area are set as an $x^{th}$ device group.

Figure 17:
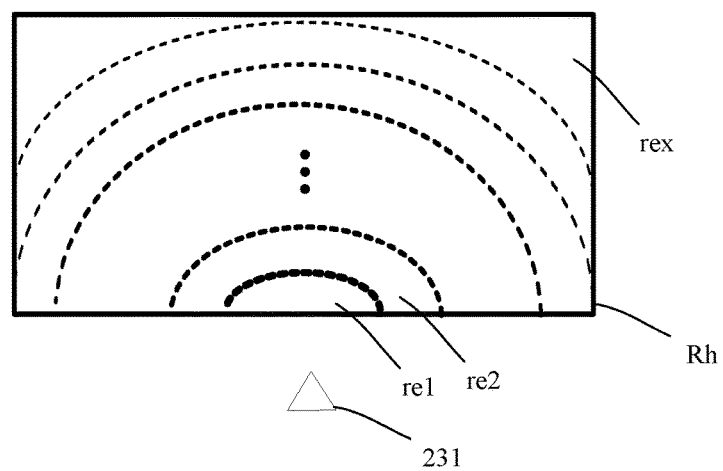
FIG. 17 is a schematic diagram of a top view of an optical fingerprint sensing area in the display module of FIG. 16.

Specifically, FIG. 17 displays and marks the optical fingerprint sensing area Rh, a first light intensity area re1 closest to the point-shaped back light source 231, a second light intensity area re2 secondly closest to the point-shaped back light source 231 and the $x^{th}$ light intensity area rex farthest to the point-shaped back light source 231. Dotted lines in FIG. 17 represent isophote lines, and the dotted lines also represent dividing lines between different light intensity areas. As shown in FIG. 17, overall shapes of the second light intensity area to the $(x-1)^{th}$ light intensity area are arc stripes, that is, an area disposed between two isophoto lines is a light intensity area.

In the present embodiment, among the device groups divided as described above, the optical fingerprint sensing devices in a $y^{th}$ device group and a $(y+1)^{th}$ device group may satisfy at least one of the following two conditions, where y may be an integer from 1 to x: in a first condition, an effective photosensitive area of the optical fingerprint sensing devices in the y device group may be smaller than an effective photosensitive area of the optical fingerprint sensing devices in the $(y+1)^{th}$ device group; in a second condition, an area of the non-opaque area around the optical fingerprint sensing devices in the y device group may be smaller than an area of the non-opaque area around the optical fingerprint sensing devices in the $(y+1)^{th}$ device group.

Figure 18:
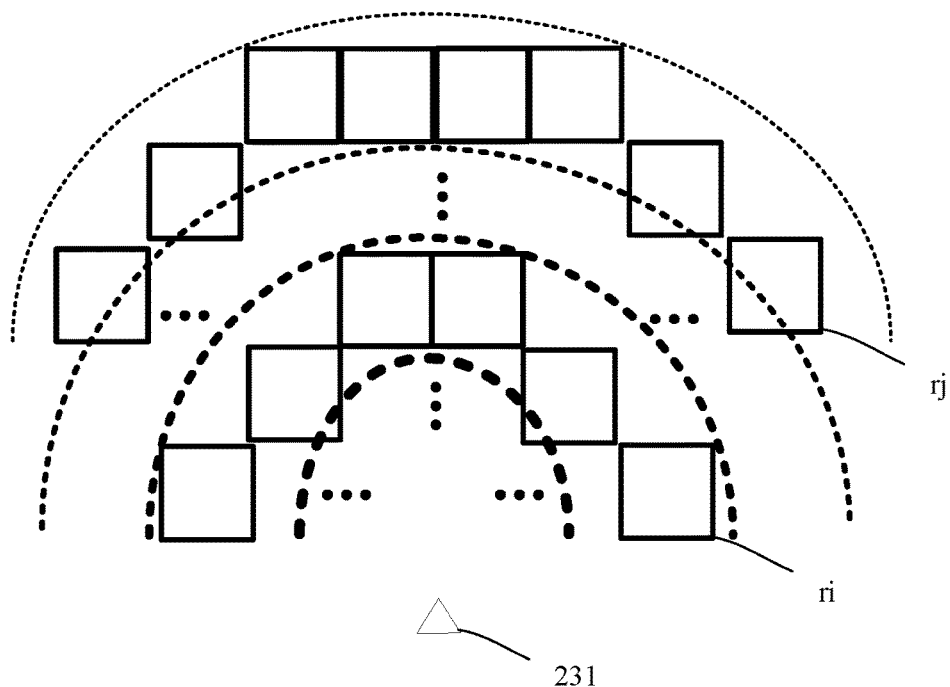
FIG. 18 is a schematic diagram of self-luminous display pixels disposed in the optical fingerprint sensing area of FIG. 17.

Specifically, as shown in FIG. 18, FIG. 18 is a schematic diagram of self-luminous display pixels disposed in the optical fingerprint sensing area of FIG. 17; FIG. 18 exhibits multiple self-luminous display pixels disposed in a $ri^{th}$ light intensity areas (self-luminous display pixels in FIG. 18 are not marked) and self-luminous display pixels disposed in a $rj^{th}$ light intensity areas, dots in FIG. 18 represent a portion of self-luminous display pixels which are omitted. Self-luminous display pixels in FIG. 18 have the same sizes, and positions of self-luminous display pixels in a same light intensity area have a tendency of bending to the point-shaped back light source 231. As shown in FIG. 18, the optical fingerprint sensing devices are arranged in rows and columns. In some embodiments, in a layout of light intensity areas divided as described above, the optical fingerprint sensing devices may not be arranged in rows and columns, which not affect divinations of the light intensity areas.

In the first condition, an device photosensitive area of the optical fingerprint sensing devices in the $y^{th}$ device group is smaller than an device photosensitive area of the optical fingerprint sensing devices in the $(y+1)^{th}$ device group, and the device photosensitive area is equal to the effective photosensitive area, so as to make the effective photosensitive area of the optical fingerprint sensing devices in the $y^{th}$ device group be smaller than the effective photosensitive area of the optical fingerprint sensing devices in the $(y+1)^{th}$ device group, or in the first condition, device photosensitive areas of the optical fingerprint sensing devices may be the same, and a light-blocking layer is disposed above the optical fingerprint sensing devices, and the light-blocking layer includes openings for exposing surfaces of the optical fingerprint sensing devices; areas of the openings of the light-blocking layer of the optical fingerprint sensing devices in the $y^{th}$ device group may be smaller than areas of openings of the light-blocking layer of the optical fingerprint sensing devices in the $(y+1)^{th}$ device group, so as to make the effective photosensitive areas of the optical fingerprint sensing devices in the $y^{th}$ device group be smaller than the effective photosensitive areas of the optical fingerprint sensing devices in the $(y+1)^{th}$ device group. In the second condition, device photosensitive areas of the optical fingerprint sensing devices are the same.

Figure 19:
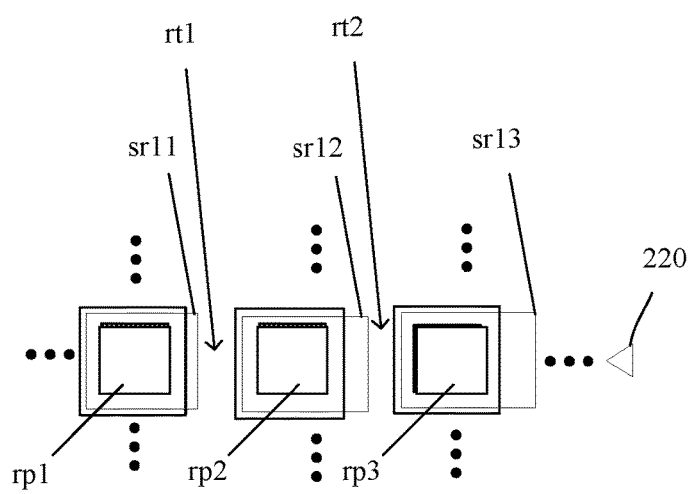
FIG. 19 is a schematic diagram of a top view of a portion of the self-luminous display pixels exhibited in detail.
Figure 20:
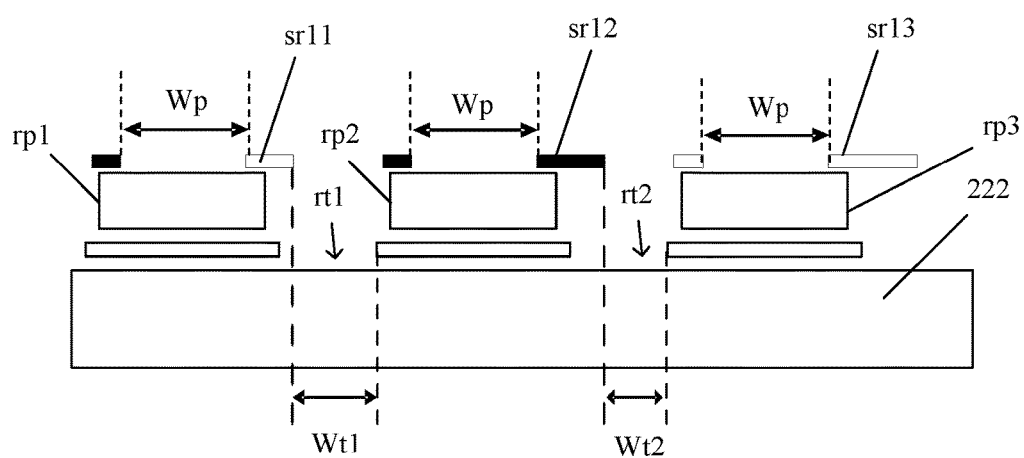
FIG. 20 is a schematic diagram of a cross-sectional view of the self-luminous display pixels in FIG. 19.

In the present embodiment, FIG. 19 and FIG. 20 exhibit a specific structure in the second condition. FIG. 19 is a schematic diagram of a top view of a portion of the self-luminous display pixels exhibited in detail, and FIG. 20 is a schematic diagram of a cross-sectional view of the self-luminous display pixels in FIG. 19.

FIG. 19 exhibits three self-luminous display pixels (the three self-luminous display pixels are not marked, and gaps among the three self-luminous display pixels are not shown), the three self-luminous display pixels may include an optical fingerprint sensing device rp1, an optical fingerprint sensing device rp2 and an optical fingerprint sensing device rp3, respectively. The optical fingerprint sensing device rp1 is covered by a light-blocking layer sr11, and the light-blocking layer sr11 includes an opening (the opening is not marked) for exposing a photosensitive surface of the optical fingerprint sensing device rp1; the optical fingerprint sensing device rp2 is covered by a light-blocking layer sr12, and the light-blocking layer sr12 includes an opening (the opening is not marked) for exposing a photosensitive surface of the optical fingerprint sensing device rp2; the optical fingerprint sensing device rp3 is covered by a light-blocking layer sr13, and the light-blocking layer sr13 includes an opening (the opening is not marked) for exposing a photosensitive surface of the optical fingerprint sensing device rp3. Areas of the openings described above are the same, and as shown in FIG. 20, widths of the openings are Wp.

FIG. 19 exhibits a portion of opaque layers (not marked), the optical fingerprint sensing devices are disposed above the opaque layers according to FIG. 20 (FIG. 20 also exhibits that the optical fingerprint sensing devices are disposed on the second substrate 222). In conjunction with FIG. 19 and FIG. 20, it should be easy to understand that according to top views and cross-sectional views of structures shown in FIG. 19 and FIG. 20, the non-opaque areas are determined by the opaque layers and the light-blocking layers. For example, a non-opaque area rt1 is limited by both the light-blocking layer sr11 and the opaque layer disposed below the optical fingerprint sensing device rp2, thus width of the non-opaque area rt1 in FIG. 20 is Wt1. Similarly, a non-opaque area rt2 is limited by both the light-blocking layer sr12 and the opaque layer disposed below the optical fingerprint sensing device rp3, thus width of the non-opaque area rt2 in FIG. 20 is Wt2. And, in FIG. 20, by configuring an area of the light-blocking layer sr12 to be larger than an area of the light-blocking layer sr12, an area of the non-opaque area rt2 is smaller than the area of the non-opaque area rt1, and thus in FIG. 20, width of the non-opaque area rt2 is smaller than width of the light-blocking layer rt1.

In conjunction with FIG. 19 and FIG. 20, it should be easy to understand that, by adjusting areas of non-opaque areas, areas of non-opaque areas around the optical fingerprint sensing devices in the $y^{th}$ device group are smaller than areas around the optical fingerprint sensing devices in the $(y+1)^{th}$ device group. In such case, structures of the second condition are applied. And, in this premise, the structures have two characteristics: firstly, as described above, device photosensitive areas of the optical fingerprint sensing devices in device groups are the same, such as the optical fingerprint sensing device rp1, the optical fingerprint sensing device rp2 and the optical fingerprint sensing device rp3 have same sizes, and they have same device photosensitive areas. Secondly, opaque layers disposed below the optical fingerprint sensing devices have the same areas. Specifically, the second character is different with structures shown in FIG. 12. Due to a difference described above, a corresponding fingerprint capture may achieve good effect, a reason is that, the opaque layers disposed below the optical fingerprint sensing devices may be a single metal layer or multiple metal layers, the metal layers may have electronic functions of storage capacitors, data lines, electrodes of the optical fingerprint sensing devices and so on; areas of opaque layers in FIG. 19 and FIG. 20 are the same, that is, compared with the structures shown in FIG. 20, in the optical fingerprint sensing devices shown in FIG. 19 and FIG. 20, structures of the storage capacitors, data lines and electrodes of the optical fingerprint sensing devices may be easy to be made into same structures, so as to make signals and signal-to-noise ratios of the optical fingerprint sensing devices be close, and an uniformity of a corresponding fingerprint image may be improved. Due to the optical fingerprint sensing devices have similar structures and properties, areas of the opaque layer disposed below each of the optical fingerprint sensing devices are similar, thus electron noises and leakage currents of the optical fingerprint sensing devices are similar (in such case, it has a convenience of following noise removal or other advantages), which is beneficial for capturing a fingerprint image with good quality.

In other words, in the present embodiment, areas of light-blocking layers disposed below the optical fingerprint sensing devices are completely same, so as to make signals and signal-to-noise ratios of the optical fingerprint sensing devices be similar, and if different areas of the light-blocking layers disposed above the optical fingerprint sensing devices are chosen (that is because, light-blocking layers disposed above the optical fingerprint sensing devices have small affects to the signals and signal-to-noise ratios, especially to noises and leakage currents), and cooperating with the opaque layers disposed below, may satisfy the second condition.

As dotted lines representing a portion of isophote lines shown in FIG. 18, the farther to the point-shaped back light source 231, the weaker the corresponding intensity of light is. A regular of variation of areas of the non-opaque areas of the self-luminous display pixels shown in FIG. 19 and FIG. 20 is contrary to a regular of variation of areas in FIG. 18. As shown in FIG. 17 to FIG. 20, by configuring the non-opaque areas of the optical fingerprint sensing devices the farther from the point-shaped back light source 231, the larger areas of the non-opaque areas of the optical fingerprint sensing devices is to make intensities d of incident light of the optical fingerprint sensing devices be similar. Therefore, effective photosensitive areas of the optical fingerprint sensing devices are the same, thereby equivalent optical absorption rate o of the optical fingerprint sensing devices being the same. Finally, products of equivalent optical absorption rate o and intensity d of incident light of the optical fingerprint sensing devices are close. Therefore, each of the optical fingerprint sensing devices may receive fingerprint signals with little differences and a similar level.

In the present embodiment, if one of the optical fingerprint sensing devices is disposed in two different light intensity areas, the one of the optical fingerprint sensing devices may be considered to be disposed in one of the two different light intensity areas where a larger portion of the one of the optical fingerprint sensing devices is disposed; and if one of the optical fingerprint sensing devices is disposed in two different light intensity areas, and the areas of the one of the optical fingerprint sensing devices is disposed in the two different light intensity areas are the same, the one of the optical fingerprint sensing devices may be considered to be disposed in any one of the two different light intensity areas.

In the present embodiment, corresponding light intensity areas are divided and cooperated with application of the first conditions or the second conditions, thus the optical fingerprint sensing devices disposed at different positions may receive fingerprint signals with similar strengths, and each of the optical fingerprint sensing devices may receive fingerprint signals with little differences and a similar level, thereby achieving a fingerprint image with good quality.

It should be noted that, in the present disclosure, various kinds of situation and various conditions are not contrary with each other, and specific implementations of the first condition and the second condition described above may be different, that is, to realize the first condition, structures in FIG. 6 or FIG. 9 of the present disclosure may be applied; to realize the second condition, structures in FIG. 12 or FIG. 20 of the present disclosure may be applied. And to realize the first condition and the second condition at a same time, combined structures mentioned in the figures may be applied, for example, combined structures in FIG. 6 and FIG. 12, may adjust areas of the optical fingerprint sensing devices with same sizes in FIG. 12 to areas with a regular of variation exhibited in FIG. 6. Therefore, descriptions of different embodiments of the present disclosure are not contrary with each other, and implementations of different embodiments in the present disclosure may be replaced or combined with each other, which are all within the protection scope of the present disclosure, and details are not described herein again.

Specifically implementations of the first condition and the second condition may refer to FIG. 5 and FIG. 6, or FIG. 8 and FIG. 9, or FIG. 11 and FIG. 12, details are not described herein again.

Although the present disclosure has been disclosed above, the present disclosure is not limited thereto. Any person skilled in the art may make various changes and modifications without departing from the spirit and scope of the present disclosure. Therefore, the protection scope of the present disclosure shall be subject to the scope defined in the claims.

What is claimed is:

1. A display module, comprising:
   a self-luminous display panel, wherein the self-luminous display panel comprises a display area where self-luminous display pixels are disposed, the display area comprises a plurality of optical fingerprint sensing areas, the self-luminous display pixel disposed in the optical fingerprint sensing area comprises a non-opaque area and an opaque area, at least a portion of the self-luminous display pixels disposed in the optical fingerprint sensing area comprise an optical fingerprint sensing device; the optical fingerprint sensing device is disposed in the opaque area; and all the optical fingerprint sensing devices are arranged in rows and columns; and at least one point-shaped back light source, wherein one of the plurality of optical fingerprint sensing areas corresponds to one of the at least one point-shaped back light source, and the point-shaped back light source is disposed obliquely below an outermost row of the optical fingerprint sensing devices in the optical fingerprint sensing area;

in one of the plurality of optical fingerprint sensing areas, a largest square region whose center is the closest to the corresponding point-shaped back light source is selected, and the largest square region comprises 2x×2x optical fingerprint sensing devices, or (2x+1)×(2x+1) optical fingerprint sensing devices, wherein x is an integer greater than 2;

in the largest square region, two rows and two columns of the optical fingerprint sensing devices furthest from the point-shaped back light source are set as an $x^{th}$ device group, two rows and two columns of the optical fingerprint sensing devices that are the secondly furthest from the point-shaped back light source are set as an $(x-1)^{th}$ device group, and other optical fingerprint sensing devices are set in a same manner, until the remained optical fingerprint sensing devices are set as a first device group; and at least one of the following two conditions is satisfied among the optical fingerprint sensing devices in a $y^{th}$ device group and the optical fingerprint sensing devices in a $(y+1)^{th}$ device group, wherein y is an integer from 1 to x:

in a first condition, an effective photosensitive area of the optical fingerprint sensing devices in the $y^{th}$ device group is smaller than an effective photosensitive area of the optical fingerprint sensing devices in the $(y+1)^{th}$ device group; or in a second condition, an area of the non-opaque area around the optical fingerprint sensing devices in the $y^{th}$ device group is smaller than an area of the non-opaque area around the optical fingerprint sensing devices in the $(y+1)^{th}$ device group.

2. The display module according to claim 1, wherein at least one optical fingerprint sensing device is configured in each pixel among k self-luminous display pixels in every group of m by n self-luminous display pixels in every optical fingerprint sensing area, where m and n are integers no less than 1, and k is an integer from 1 to m×n.

3. The display module according to claim 1, wherein in the first condition, an device photosensitive area of the optical fingerprint sensing devices in the $y^{th}$ device group is smaller than an device photosensitive area of the optical fingerprint sensing devices in the $(y+1)^{th}$ device group, and the device photosensitive area is equal to the effective photosensitive area, so as to make the effective photosensitive area of the optical fingerprint sensing devices in the $y^{th}$ device group be smaller than the effective photosensitive area of the optical fingerprint sensing devices in the $(y+1)^{th}$ device group.

4. The display module according to claim 1, wherein in the first condition, the device photosensitive areas of the optical fingerprint sensing devices are the same, a light blocking layer is disposed above the optical fingerprint sensing devices, the light blocking layer comprises an opening exposing a surface of the optical fingerprint sensing devices, and an area of the opening of the light blocking layer of the optical fingerprint sensing devices in the $y^{th}$ device group is smaller than an area of the opening of the light blocking layer of the optical fingerprint sensing devices in the $(y+1)^{th}$ device group, so as to make the effective photosensitive area of the optical fingerprint sensing devices in the $y^{th}$ device group be smaller than the effective photosensitive area of the optical fingerprint sensing devices in the $(y+1)^{th}$ device group.

5. The display module according to claim 1, wherein in the second condition, device photosensitive areas of the optical fingerprint sensing devices are the same.

6. The display module according to claim 1, wherein in one of the plurality of optical fingerprint sensing areas, a rows of optical fingerprint sensing devices disposed outside of the largest square region are remained, a is an integer greater than 1, among the a rows of optical fingerprint sensing devices, a row of optical fingerprint sensing devices closest to the point-shaped back light source are set as an $(x+1)^{th}$ device group, and other optical fingerprint sensing devices are set in a same manner, until a row of optical fingerprint sensing devices furthest from the point-shaped back light source are set as an $(x+a)^{th}$ device group; and at least one of the following two conditions is satisfied among the optical fingerprint sensing devices in a $z^{th}$ device group and the optical fingerprint sensing devices in a $(z+1)^{th}$ device group, wherein z is an integer from x to (x+a):

in a first condition, an effective photosensitive area of the optical fingerprint sensing devices in the $z^{th}$ device group is smaller than an effective photosensitive area of the optical fingerprint sensing devices in the $(z+1)^{th}$ device group; or in a second condition, an area of the non-opaque area around the optical fingerprint sensing devices in the $z^{th}$ device group is smaller than an area of the non-opaque area around the optical fingerprint sensing devices in the $(z+1)^{th}$ device group.

7. The display module according to claim 1, wherein in one of the plurality of optical fingerprint sensing areas, 2a columns of optical fingerprint sensing devices symmetrically disposed on two sides of the largest square region are remained, a is an integer greater than 1, among the 2a columns of optical fingerprint sensing devices, two columns of optical fingerprint sensing devices closest to the point-shaped back light source are set as an $(x+1)^{th}$ device group, and other optical fingerprint sensing devices are set in a same manner, until two columns of optical fingerprint sensing devices furthest from the point-shaped back light source are set as an $(x+a)^{th}$ device group; and at least one of the following two conditions is satisfied among the optical fingerprint sensing devices in a $Z^{th}$ device group and the optical fingerprint sensing devices in a $(z+1)^{th}$ device group, wherein z is an integer from x to (x+a):

in a first condition, an effective photosensitive area of the optical fingerprint sensing devices in the $z^{th}$ device group is smaller than an effective photosensitive area of the optical fingerprint sensing devices in the $(z+1)^{th}$ device group; or in a second condition, an area of the non-opaque area around the optical fingerprint sensing devices in the $Z^{th}$ device group is smaller than an area of the non-opaque area around the optical fingerprint sensing devices in the $(z+1)^{th}$ device group.

8. A display module, comprising: a self-luminous display panel, wherein the self-luminous display panel comprises a display area where self-luminous display pixels are disposed, the display area comprises a plurality of optical fingerprint sensing areas, the self-luminous display pixels disposed in the optical fingerprint sensing area comprise a non-opaque area and an opaque area, at least a portion of the self-luminous display pixels disposed in the plurality of optical fingerprint sensing area comprise an optical fingerprint sensing device; the optical fingerprint sensing device is disposed in the opaque area; and all the optical fingerprint sensing devices are arranged in rows and columns; and at least one point-shaped back light source, wherein one of the plurality of optical fingerprint sensing areas corresponds to one of the at least one point-shaped back light source, and the point-shaped back light source is disposed obliquely below an outermost row of the optical fingerprint sensing devices in the optical fingerprint sensing area;

wherein in one of the plurality of optical fingerprint sensing areas, a largest rectangle region whose center is the closest to the corresponding point-shaped back light source is selected, and the largest rectangle region comprises x×(2x−1) optical fingerprint sensing devices arranged in x rows and 2x−1 columns, or comprises x×2x optical fingerprint sensing devices, arranged in x rows and 2x columns, x is an integer greater than 2;

in the largest rectangle region, one row and two columns of the optical fingerprint sensing devices furthest from the point-shaped back light source are set as an $x^{th}$ device group, and except the $x^{th}$ device group, one row and two columns of the optical fingerprint sensing devices that are the secondly furthest from the point-shaped back light source are set as an $(x−1)^{th}$ device group, and other optical fingerprint sensing devices are set in a same manner, until the remained optical fingerprint sensing devices are set as a first device group; and at least one of the following two conditions is satisfied among the optical fingerprint sensing devices in a $y^{th}$ device group and the optical fingerprint sensing devices in a $(y+1)^{th}$ device group, wherein y is any integer from 1 to x:

in a first condition, an effective photosensitive area of the optical fingerprint sensing devices in the $y^{th}$ device group is smaller than an effective photosensitive area in the optical fingerprint sensing devices in the $(y+1)^{th}$ device group; or in a second condition, the area of the non-opaque area around the optical fingerprint sensing devices of the $y^{th}$ device group is smaller than the area of the non-opaque area around the optical fingerprint sensing devices of the $(y+1)^{th}$ device group.

9. The display module according to claim 8, wherein at least one optical fingerprint sensing device is configured in each pixel among k self-luminous display pixels in every group of m by n self-luminous display pixels in every optical fingerprint sensing area, where m and n are any integers no less than 1, and k is an integer from 1 to m×n.

10. The display module according to claim 8, wherein in the first condition, an device photosensitive area of the optical fingerprint sensing devices in the $y^{th}$ device group is smaller than an device photosensitive area of the optical fingerprint sensing devices in the $(y+1)^{th}$ device group, and the device photosensitive area is equal to the effective photosensitive area, so as to make the effective photosensitive area of the optical fingerprint sensing devices in the $y^{th}$ device group be smaller than the effective photosensitive area of the optical fingerprint sensing devices in the $(y+1)^{th}$ device group.

11. The display module according to claim 8, wherein in the first condition, areas of the device photosensitive areas of the optical fingerprint sensing devices are the same, a light-blocking layer is disposed above the optical fingerprint sensing devices, the light-blocking layer comprises an opening for exposing a surface of the optical fingerprint sensing devices and an area of the opening of the light-blocking layer of the optical fingerprint sensing devices in the $y^{th}$ device group is smaller than an area of the opening of the light-blocking layer of the optical fingerprint sensing devices in the $(y+1)^{th}$ device group, so as to make the effective photosensitive area of the optical fingerprint sensing devices in the $y^{th}$ device group is smaller than the effective photosensitive area of the optical fingerprint sensing devices in the $(y+1)^{th}$ device group.

12. The display module according to claim 8, wherein in the second condition, device photosensitive areas of the optical fingerprint sensing devices are the same.

13. The display module according to claim 8, wherein in one of the plurality of optical fingerprint sensing areas, a rows of optical fingerprint sensing devices disposed outside of the largest rectangle region are remained, a is an integer greater than 1, among the a rows of the optical fingerprint sensing devices, a row of optical fingerprint sensing devices closest to the point-shaped back light source are set as an $(x+1)^{th}$ device group, and other optical fingerprint sensing devices are set in a same manner, until a row of the optical fingerprint sensing devices furthest from the point-shaped back light source are set as an $(x+a)^{th}$ device group; and at least one of the following two conditions is satisfied among the optical fingerprint sensing devices of a $Z^{th}$ device group and the optical fingerprint sensing devices of a $(z+1)^{th}$ device group, wherein z is an integer from x to x+a:

in a first condition, an effective photosensitive area of the optical fingerprint sensing devices in the $z^{th}$ device group is smaller than an effective photosensitive area of the optical fingerprint sensing devices in the $(z+1)^{th}$ device group; or in a second condition, an area of the non-opaque area around the optical fingerprint sensing devices in the $Z^{th}$ device group is smaller than an area of the non-opaque area around the optical fingerprint sensing devices in the $(z+1)^{th}$ device group.

14. The display module according to claim 8, wherein in one of the plurality of optical fingerprint sensing areas, 2a columns of optical fingerprint sensing devices symmetrically disposed on two sides of the largest rectangle region are remained, a is an integer greater than 1, among the 2a columns of the optical fingerprint sensing devices, two columns of optical fingerprint sensing devices closest to the point-shaped back light source are set as an $(x+1)^{th}$ device group, and other optical fingerprint sensing devices are set in a same manner, until two columns of optical fingerprint sensing devices furthest from the point-shaped back light source are set as an $(x+a)^{th}$ device group; and at least one of the following two conditions is satisfied among the optical fingerprint sensing devices of a $Z^{th}$ device group and the optical fingerprint sensing devices of a $(z+1)^{th}$ device group, wherein z is an integer from x to x+a:

in a first condition, an effective photosensitive area of the optical fingerprint sensing devices in the $z^{th}$ device group is smaller than an effective photosensitive area of the optical fingerprint sensing devices in the $(z+1)^{th}$ device group; or in a second condition, an area of the non-opaque area around the optical fingerprint sensing devices in the $Z^{th}$ device group is smaller than an area of the non-opaque area around the optical fingerprint sensing devices in the $(z+1)^{th}$ device group.

15. A display module, comprising:

a self-luminous display panel, wherein the self-luminous display panel comprises a display area where self-luminous display pixels are disposed, the display area comprises a plurality of optical fingerprint sensing areas, the self-luminous display pixel disposed in the optical fingerprint sensing area comprises a non-opaque area and an opaque area, at least a portion of the self-luminous display pixels disposed in the optical fingerprint sensing areas comprise an optical fingerprint sensing device; the optical fingerprint sensing device is disposed in the opaque area; and all the optical fingerprint sensing devices are arranged in rows and columns; and at least one point-shaped back light source, wherein one of the plurality of the optical fingerprint sensing areas corresponds to one of the at least one point-shaped back light source, and the point-shaped back light source is disposed obliquely below the optical fingerprint sensing devices;

wherein one of the plurality of the optical fingerprint sensing areas is divided into a plurality of light intensity areas sequentially from a first light intensity area to an $x^{th}$ light intensity area according to a distance relative to the point-shaped back light source, from a shortest distance to a longest distance, and an overall shape of a second light intensity area to an $(x-1)^{th}$ light intensity area is an arc bar or an elliptical arc bar, wherein x is an integer greater than 3;

the optical fingerprint sensing devices disposed in the first light intensity area are set as a first device group, the optical fingerprint sensing devices disposed in the second light intensity area are set as a second device group, and the optical fingerprint sensing devices disposed in the x light intensity area are set as an $x^{th}$ device group;

at least one of the following two conditions is satisfied among the optical fingerprint sensing devices in a $y^{th}$ device group and optical fingerprint sensing devices in a $(y+1)^{th}$ device group, wherein y is an integer from 1 to x:

in a first condition, an effective photosensitive area of the optical fingerprint sensing devices in the $y^{th}$ device group is smaller than an effective photosensitive area in the optical fingerprint sensing devices in the $(y+1)^{th}$ device group; or in a second condition, an area of the non-opaque area around the optical fingerprint sensing devices in the $y^{th}$ device group is smaller than an area of the non-opaque area around the plurality of optical fingerprint sensing devices in the $(y+1)^{th}$ device group.

16. The display module according to claim 15, wherein at least one optical fingerprint sensing device is configured in each pixel among k self-luminous display pixels in every group of m by n self-luminous display pixels in every optical fingerprint sensing area, where m and n are integers no less than 1, and k is an integer from 1 to m×n; and in the optical fingerprint sensing area, the self-luminous display pixel comprises a non-opaque area and a opaque area, the optical fingerprint sensing devices are disposed in the non-opaque area.

17. The display module according to claim 15, wherein in the first condition, an device photosensitive area of the optical fingerprint sensing devices in the $y^{th}$ device group is smaller than an device photosensitive area of the optical fingerprint sensing devices in the $(y+1)^{th}$ device group, and the device photosensitive area is equal to the effective photosensitive area, so as to make the effective photosensitive area of the optical fingerprint sensing devices in the $y^{th}$ device group be smaller than the effective photosensitive area of optical fingerprint sensing devices in the $(y+1)^{th}$ device group.

18. The display module according to claim 15, wherein, in the first condition, the device photosensitive areas of the optical fingerprint sensing devices are the same, a light-blocking layers is disposed above the optical fingerprint sensing devices, and the light-blocking layer comprises an opening for exposing a surface of the optical fingerprint sensing devices, and an area of the opening of the light-blocking layer of the optical fingerprint sensing devices in the $y^{th}$ device group are smaller than an area of the opening of the light-blocking layer of the optical fingerprint sensing devices in the $(y+1)^{th}$ device group, so as to make an effective photosensitive area of the optical fingerprint sensing devices in the $y^{th}$ device group be smaller than an effective photosensitive area of optical fingerprint sensing devices in the $(y+1)^{th}$ device group.

19. The display module according to claim 15, wherein in the second condition, device photosensitive areas of the optical fingerprint sensing devices are the same.

20. The display module according to claim 15, wherein if one of the optical fingerprint sensing devices is disposed in two different light intensity areas, the one of the optical fingerprint sensing devices is considered to be disposed in one of the two different light intensity areas where a larger portion of the optical fingerprint sensing device is disposed; and if one of the optical fingerprint sensing devices is disposed in two different light intensity areas, and the areas of the optical fingerprint sensing device disposed in the two different light intensity areas are the same, the one of the optical fingerprint sensing devices is considered to be disposed in any one of the two different light intensity areas.

* * * * *